(12) United States Patent
Schumacher et al.

(10) Patent No.: US 9,529,946 B1
(45) Date of Patent: Dec. 27, 2016

(54) PERFORMANCE ESTIMATION USING CONFIGURABLE HARDWARE EMULATION

(71) Applicant: Xilinx, Inc., San Jose, CA (US)

(72) Inventors: Paul R. Schumacher, Berthoud, CO (US); Graham F. Schelle, Longmont, CO (US); Patrick Lysaght, Los Gatos, CA (US); Alan M. Frost, Cupertino, CA (US)

(73) Assignee: XILINX, INC., San Jose, CA (US)

( * ) Notice: Subject to any disclaimer, the term of this patent is extended or adjusted under 35 U.S.C. 154(b) by 847 days.

(21) Appl. No.: 13/676,035

(22) Filed: Nov. 13, 2012

(51) Int. Cl.
*G06F 17/50* (2006.01)
*G06F 11/26* (2006.01)

(52) U.S. Cl.
CPC ......... *G06F 17/5022* (2013.01); *G06F 11/261* (2013.01)

(58) Field of Classification Search
CPC .............. G06F 17/5022; G06F 2217/78; G06F 17/5027; G06F 17/5045; G06F 17/505; G06F 11/261; G06F 17/5009; G06F 17/504; G06F 11/26; G06F 11/3644; G06F 11/3648; G06F 11/3656; G06F 17/5036; G06F 11/263
USPC .... 703/14; 713/320, 340; 716/104, 103, 116
See application file for complete search history.

(56) References Cited

U.S. PATENT DOCUMENTS

| | | | |
|---|---|---|---|
| 5,327,361 A | 7/1994 | Long et al. | |
| 5,548,785 A | 8/1996 | Fogg et al. | |
| 5,644,498 A * | 7/1997 | Joly et al. | 716/103 |
| 5,937,179 A | 8/1999 | Swoboda | |
| 5,946,472 A | 8/1999 | Graves et al. | |
| 6,173,434 B1 * | 1/2001 | Wirthlin et al. | 716/116 |
| 6,345,378 B1 * | 2/2002 | Joly et al. | 716/104 |
| 7,290,228 B2 | 10/2007 | Guenther et al. | |
| 7,330,808 B1 * | 2/2008 | Jorgensen et al. | 703/14 |
| 7,444,276 B2 | 10/2008 | Watt et al. | |
| 7,756,695 B2 | 7/2010 | O'Niell et al. | |
| 7,769,577 B2 | 8/2010 | Guenther et al. | |
| 7,865,346 B2 | 1/2011 | Gunther et al. | |
| 7,877,249 B2 | 1/2011 | Guenther et al. | |
| 8,122,398 B2 * | 2/2012 | Veller et al. | 716/103 |
| 2003/0105617 A1 | 6/2003 | Cadambi et al. | |
| 2004/0078179 A1 | 4/2004 | Fuji et al. | |
| 2004/0123258 A1 | 6/2004 | Butts | |
| 2005/0256696 A1 | 11/2005 | Goodling et al. | |
| 2006/0155525 A1 | 7/2006 | Aguilar et al. | |
| 2006/0190232 A1 | 8/2006 | Guenther et al. | |

(Continued)

OTHER PUBLICATIONS

UG786 (Power Methodology Guide, Xilinx, Mar. 1, 2011).*

(Continued)

*Primary Examiner* — Kamini S Shah
*Assistant Examiner* — Scott S Cook
(74) *Attorney, Agent, or Firm* — Kevin T. Cuenot

(57) ABSTRACT

An integrated circuit can include a processor operable to execute program code and an Intellectual Property (IP) modeling block. The IP modeling block can include a first port through which the IP modeling block receives first modeling data and a second port coupled to the processor through which the first IP modeling block communicates with the processor during emulation. The first IP modeling block also can include a power emulation circuit. The power emulation circuit is configured to consume a variable amount of power as specified by the first modeling data received via the first port.

14 Claims, 10 Drawing Sheets

(56) References Cited

U.S. PATENT DOCUMENTS

| | | | |
|---|---|---|---|
| 2007/0044079 | A1 | 2/2007 | Ganesan et al. |
| 2007/0067150 | A1 | 3/2007 | Musselman |
| 2007/0074000 | A1 | 3/2007 | Colwill et al. |
| 2007/0162270 | A1 | 7/2007 | Guenther et al. |
| 2007/0294071 | A1 | 12/2007 | Guenther et al. |
| 2008/0222633 | A1 | 9/2008 | Kami |
| 2008/0243462 | A1 | 10/2008 | Guenther et al. |
| 2008/0288230 | A1 | 11/2008 | Fernsler et al. |
| 2008/0306721 | A1 | 12/2008 | Yang |
| 2008/0306722 | A1 | 12/2008 | Fujii et al. |
| 2010/0201695 | A1 | 8/2010 | Hill et al. |
| 2011/0035203 | A1* | 2/2011 | Dalton et al. ............ 703/14 |
| 2011/0107162 | A1 | 5/2011 | Martinez Canedo et al. |
| 2011/0145646 | A1* | 6/2011 | Harris ............ G06F 11/263 714/37 |
| 2011/0283131 | A1* | 11/2011 | Yamamoto ............ 713/340 |
| 2011/0307233 | A1 | 12/2011 | Tseng et al. |
| 2012/0144216 | A1* | 6/2012 | Hsieh et al. ............ 713/320 |
| 2012/0144376 | A1 | 6/2012 | Van Eijndhoven et al. |
| 2012/0284446 | A1 | 11/2012 | Brian et al. |
| 2013/0170525 | A1 | 7/2013 | Asaad et al. |
| 2013/0212554 | A1 | 8/2013 | Maeda et al. |
| 2014/0107999 | A1* | 4/2014 | Frenkil ............ 703/17 |

OTHER PUBLICATIONS

Moss (Recent Experience on an ESL Framework for Rapid Design Exploration using Hardware-Software Codesign for ARM based FPGAs, MPSoC 2012).*
Maillet-Contoz (Chapter 2 Transaction Level Modeling: An Abstraction Beyond RTL, 2005).*
Baily (Low Power Design and Verification Techniques White Paper, Mentor Graphics, 2007).*
Bombieri (RTL-TLM Equivalence Checking Based on Simulation, VER-TIGO FP6-2005-IST-5-033709).*
Kim, Hyesoon, Poer Measurement for Computer and Computer Architecture Research, Georgia Tech, NSF I/UCRC CERCS Industry Advisory Board Meeting—I/UCRC CERCS 2010.*
Santarini, M., Zynq-7000 EPP sets stage for new era of innovations, Xilinx Xcell Journal Jun. 17, 2011.*
Rajagopalan, V., Xilinx Zynq—7000 EPP: An Extensible Processing Platform Family, Aug. 18, 2011.*
Winterholer, M., HW/SW Verification from an Open System C virtual prototype through simulation, emulation, and FPGA prototyping, Design Automation and Test in Europe (DATE 2012), Dresden, Germany Mar. 12-16, 2012.*
Lysaght, P., The Programmable Logic Perspective; FPL-2010, Sep. 2010, Milano, Italy.*
Carbon_2011, Carbon Adds AXI Analysis Capabilities to SoC Designer Plus, New Release dated May 25, 2011, Carbon Design Systems, 125 Nagog Park, Acton, Mass.*
Mammeri, N., Fast SoC Architecture Exploration Using Traffic Simulation Techniques, DVClub Apr. 2010: Verification of re-used Design IP, Bristol, Cambridge and Eindhoven.*
DeHaven, K., Extensible Processing Platform Ideal Solution for a Wide Range of Embedded Systems, Xilinx WP369 (v1.0) Apr. 27, 2010.*
TLM, Transaction-level modeling, Definition, Archived Wikipedia dated Oct. 4, 2011.*
Mshahbaz (AXI4 Stream Generator and Checker, Jul. 15, 2012 https://github.com/NetFPGA/NetFPGA-public/wiki/AXI4-Stream-Generator-and-Checker).*
Chehida, K.B., Auguin, M., HW/SW Partitioning Approach for Reconfigurable System Design, CASES 2002, Oct. 8-11, 2002, Grenoble, France Copyright 2000 ACM.*
Chatha, K., Vemuri, R., An Iterative Algorithm for Hardware-Software Partitioning, Hardware Design Space Exploration and Scheduling, Design Automation for Embedded Systems, 5, 281-293 (2000).*
Moss, L., Guerard, H., Dare, G., Bois, G., Rapid Design Exploration on an ESL Framwork features Hardware-Software Codesign for ARM Processor-based FPGA's, Space Codesign White Paper, 2012.*
U.S. Appl. No. 14/278,263, filed May 15, 2014, Schumacher et al.
U.S. Appl. No. 14/280,211, filed May 16, 2014, Schumacher et al.
Pratt, Brian et al., "Improving FPGA Design Robustness with Partial TMR," 44$^{th}$ Annual IEEE International Physics Symposium Proceedings, Mar. 26, 2006, pp. 226-232, IEEE, Piscataway, New Jersey, USA.
U.S. Appl. No. 13/398,790, filed Feb. 16, 2012, Schumacher, Paul R. et al., Xilinx, Inc., 2100 Logic Dr., San Jose, CA USA.
ARM, "ARM Profiler Non-Intrusive Performance Analysis", 3 pgs., printed Nov. 22, 2011from website http://www.arm.com/products/tools/software-tools/rvds/arm-profiler.php.
Berkeley Design Technology, Inc., "An Independent Evaluation of: The AutoESL AutoPilot High-Level Synthesis Tool", BDTi 2010, pp. 1-14, www.BDTI.com.
Kyung, Hyun-Min, et al., "Performance Monitor Unit Design for an AXI-based Multi-Core SoC Platform", pp. Mar. 2007, 1565-1572, SAC '07, Proceedings of 2007 ACM symposium on Applied computing, ACM.
Park, Gi-Ho, et al., "Building Various Levels of SOC Architecture Exploration Environments: System Level Simulator, Emulator and FPGA Prototype Board", Jun. 9, 2009, 5 pp., Advanced Program for WARP2007, Samsung Electronics.
Xilinx, Inc., "AXI Bus Functional Model v1.9", Product Brief, PB 001, Jun. 22, 2011, pp. 1-3, Xilinx, Inc., 2100 Logic Drive, San Jose, CA 95124, http://www.xilinx.com/support/documentation_/ip_documentation/cdn_axibfm/v1_9/pb001_axi_bfm.pdf.
Xilinx, Inc., "AXI Bus Functional Model v2.1", Product Specification, DS824, Oct. 19, 2011, pp. 1-51, Xilinx, Inc., 2100 Logic Drive, San Jose, CA 95124, http://www.xilinx.com/support/documentation_/ipdocumentation/cdn_axi_bfm/v2.1/ds824_axi_bfm.pdf.

* cited by examiner

1000

```
1   process_frames( )
2   {
3      in_current = malloc(size);
4   ...
5      for(each frame...){
6         ...
7            manr(strength,
8                in_current,
9                in_prev,
10               yc_out_1);
11           sobel_filter(yc_out_1, yc_out_2);
12           ycbcr2rgb(yc_out_2,
13                    FRAME_BUFFER);
14        ...
15     }
16  }
17
18  void manr (char nr_strength,
19             AXI_PIXEL yc_in[NUMROWS, NUMCOLS],
20             AXI_PIXEL yc_in[NUMROWS, NUMCOLS],
21             AXI_PIXEL yc_in[NUMROWS, NUMCOLS])
22  {
23      AP_BUS_AXI_STREAMD(yc_in, YC_IN);
24      AP_BUS_AXI_STREAMD(yc_in_prev, YC_IN_PREV);
25      AP_BUS_AXI_STREAMD(yc_out, YC_OUT);
```

FIG. 10

PERFORMANCE ESTIMATION USING CONFIGURABLE HARDWARE EMULATION

RESERVATION OF RIGHTS IN COPYRIGHTED MATERIAL

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

One or more embodiments disclosed within this specification relate to integrated circuits (ICs). More particularly, one or more embodiments relate to estimating performance through emulation using configurable hardware within an IC.

BACKGROUND

Estimating the likely performance of a system is an important part of the design process. A variety of performance estimation tools are available for system designers of application specific integrated circuits (ASICs). Similarly, a variety of different performance estimation tools are available for developing purely software-based systems.

Whether hardware-based or software based, the approach taken by most performance estimation tools is to add monitor functionality to existing systems. This approach necessarily infers that the complete design for which performance estimation is desired, whether hardware or software, is fully realized. The necessity of having a fully realized design makes many performance estimation tools unusable in the early stages of system design when many architectural decisions are made.

SUMMARY

An integrated circuit includes a processor operable to execute program code and a first intellectual property (IP) modeling block. The first IP modeling block includes a first port through which the first IP modeling block receives first modeling data, a second port coupled to the processor through which the first IP modeling block communicates with the processor during emulation, and a power emulation circuit configured to consume a variable amount of power during emulation according to the first modeling data.

A method of emulating power consumption of a design for an electronic system includes implementing a configurable hardware platform within a programmable integrated circuit, wherein the configurable hardware platform comprises an intellectual property (IP) modeling block coupled to a processor of the programmable integrated circuit. The method includes programming the IP modeling block with a performance profile specifying a data traffic pattern implemented by a traffic generator of the IP modeling block during emulation and a power profile specifying power consumption for a power emulation circuit within the IP modeling block implemented during emulation. The method further includes measuring power consumption of the programmable integrated circuit while the configurable hardware platform is implemented within the programmable integrated circuit.

A method of emulating an electronic system includes, using a processor, determining a data flow through a first segment of a design for the electronic system specified in a high level language. The first segment is selected for emulation as a circuit module implementation of the first segment within a configurable hardware platform that includes an IP modeling block in communication with a processor configured to execute a second segment of the design. The method further includes generating a performance profile for the IP modeling block of the configurable hardware platform from the data flow. The performance profile programs the IP modeling block to emulate the circuit module implementation of the first segment during an emulation of the electronic system by the configurable hardware platform.

BRIEF DESCRIPTION OF THE DRAWINGS

FIG. 10 illustrates exemplary program code specifying a design for an electronic system.

DETAILED DESCRIPTION OF THE DRAWINGS

While the specification concludes with claims defining novel features, it is believed that the various features disclosed within this specification will be better understood from a consideration of the description in conjunction with the drawings. The process(es), machine(s), manufacture(s) and any variations thereof described within this specification are provided for purposes of illustration. Specific structural and functional details disclosed within this specification are not to be interpreted as limiting, but merely as a basis for the claims and as a representative basis for teaching one skilled in the art to variously employ the features described in virtually any appropriately detailed structure.

This specification relates to integrated circuits (ICs) and, more particularly, to estimating performance of a system through emulation using configurable hardware within an IC. In accordance with the inventive arrangements disclosed within this specification, an IC is used to implement a configurable hardware platform that is operable to emulate a design for an electronic system. The electronic system to be emulated can be one with an architecture that includes one or more circuit modules. The electronic system to be emulated further can include a processor that operates cooperatively with the circuit module(s).

In one aspect, the design for the electronic system is specified as program code having one or more segments. Various segments of the design can be selected for emulation within the configurable hardware platform as if implemented as a circuit module, e.g., in hardware. Other segments of the program code can be emulated by the configurable hardware platform as if executed by the processor interacting with the circuit modules. In another aspect, however, system designers can specify the particular types of circuit blocks to be included within a system to be emulated in a more direct manner without specifying such modules programmatically, e.g., using a high level language.

The design for the electronic system that is emulated can be incomplete in that the electronic system to be emulated is only partially, e.g., not fully, specified. As such, the configurable hardware platform can be used to emulate one or more potential architectures for the electronic system in which different segments or portions of the design are selected for implementation as hardware. Accordingly, the performance of the resulting system architecture can be estimated with a high degree of accuracy without having to design actual circuit implementations of the various segments selected for implementation.

Figure 1:
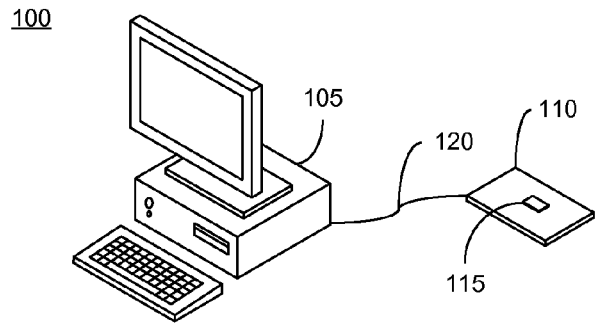
FIG. 1 is a block diagram illustrating an example of an emulation system.

FIG. 1 is a block diagram illustrating an example of an emulation system 100. As shown, a host processing system, e.g., a computer, 105 (hereafter "host") is coupled to a test platform 110. In one aspect, test platform 110 is implemented as a printed circuit board or other physical structure capable of hosting or receiving an IC 115. IC 115 can be a programmable IC. Host 105 can communicate with IC 115 via a communication link 120, e.g., a channel, coupled to test platform 110. For example, test platform 110 includes one or more different physical connectors that couple to communication link 120 and that connect to a socket, receptacle, or other structure on test platform 110 upon, or in, which IC 115 is mounted or attached.

Through communication link 120, host 105 can send configuration data including bitstreams, programming data for Intellectual Property (IP) modeling blocks, and input test data such as test vectors for use during emulation to IC 115. Host 105 can receive test data collected by circuitry within IC 115 and/or test platform 110 via communication link 120. In one aspect, for example, communication link 120 can be coupled to a Joint Test Action Group (JTAG) port of IC 115 through which data can be input or output.

Figure 2:
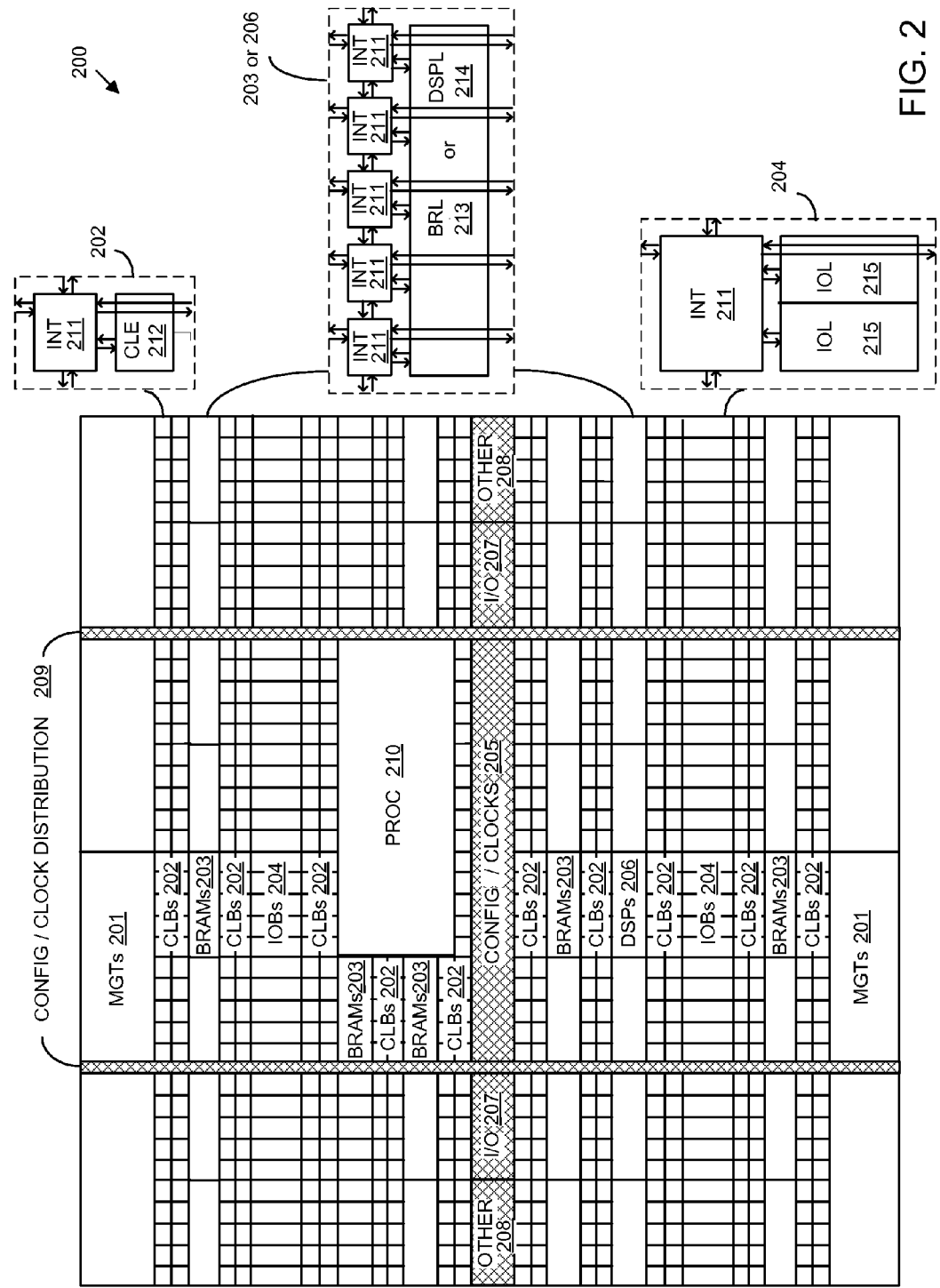
FIG. 2 is a block diagram illustrating an exemplary architecture for an integrated circuit (IC).

FIG. 2 is a block diagram illustrating an exemplary architecture 200 for an IC. Architecture 200 can be used to implement IC 115 of FIG. 1 to provide the configurable hardware platform previously noted for emulating designs of electronic systems. In one aspect, architecture 200 is implemented within a field programmable gate array (FPGA) type of IC.

As shown, architecture 200 includes several different types of programmable circuit, e.g., logic, blocks. For instance, architecture 200 includes a large number of different programmable tiles including multi-gigabit transceivers (MGTs) 201, configurable logic blocks (CLBs) 202, random access memory blocks (BRAMs) 203, input/output blocks (IOBs) 204, configuration and clocking logic (CONFIG/CLOCKS) 205, digital signal processing blocks (DSPs) 206, specialized I/O blocks 207 (e.g., configuration ports and clock ports), and other programmable logic 208 such as digital clock managers, analog-to-digital (AD) converters, digital-to-analog (DA) converters, system monitoring logic, and so forth.

In some ICs, each programmable tile includes a programmable interconnect element (INT) 211 having standardized connections to and from a corresponding INT 211 in each adjacent tile. Therefore, the INTs 211, taken together, implement the programmable interconnect structure for the illustrated IC. Each INT 211 also includes the connections to and from the programmable logic element within the same tile, as shown by the examples included at the right of FIG. 2.

For example, a CLB 202 can include a configurable logic element (CLE) 212 that can be programmed to implement user logic plus a single INT 211. A BRAM 203 can include a BRAM logic element (BRL) 213 in addition to one or more INTs 211. Typically, the number of INTs 211 included in a tile depends on the height of the tile. In the pictured embodiment, a BRAM tile has the same height as five CLBs, but other numbers (e.g., four) can also be used. A DSP tile 206 can include a DSP logic element (DSPL) 214 in addition to an appropriate number of INTs 211. An 10B 204 can include, for example, two instances of an I/O logic element (IOL) 215 in addition to one instance of an INT 211. As will be clear to those of skill in the art, the actual I/O pads connected, for example, to IOL 215 typically are not confined to the area of IOL 215.

In the example pictured in FIG. 2, a columnar area near the center of the die, e.g., formed of regions 205, 207, and 208, are used for configuration, clock, and other control logic. Horizontal areas 209 extending from this column are used to distribute the clocks and configuration signals across the breadth of the programmable IC.

Some ICs utilizing the architecture illustrated in FIG. 2 include additional logic blocks that disrupt the regular columnar structure making up a large part of the IC. The additional logic blocks can be programmable blocks and/or dedicated circuitry. For example, a processor block depicted as PROC 210 spans several columns of CLBs and BRAMs.

In one aspect, PROC 210 is implemented as dedicated circuitry, e.g., as a hard-wired processor, that is fabricated as part of the die that implements the programmable circuitry of the IC. PROC 210 can represent any of a variety of different processor types and/or systems ranging in complexity from an individual processor, e.g., a single core central processing unit capable of executing program code, to an entire processor system having one or more cores, modules, co-processors, interfaces, or the like.

In another aspect, PROC 210 is omitted from architecture 200 and replaced with one or more of the other varieties of the programmable blocks described. The programmable blocks can be utilized to form a "soft processor" in that the various blocks of programmable circuitry can be used to form a processor that can execute program code as is the case with PROC 210.

The phrase "programmable circuitry" refers to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 2 that are external to PROC 210 such as CLBs 203 and BRAMs 203 can be considered programmable circuitry of the IC.

In general, the functionality of programmable circuitry is not established until configuration data is loaded into the IC. A set of configuration bits can be used to program programmable circuitry of an IC such as an FPGA. The configuration bit(s) typically are referred to as a "configuration bitstream." In general, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not programmed with functionality after the manufacture of the IC through the loading of a configuration bitstream. Hardwired circuitry is generally considered to have dedicated circuit blocks and interconnects, for example, that have a particular functionality and are functional without first loading a configuration bitstream into the IC, e.g., PROC 210.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function when manufactured as part of the IC.

The programmability of a processor such as PROC 210 is to be distinguished from programmable circuitry. Programmable circuitry is configurable to implement different physical circuit architectures through the loading of configuration data. The programmable circuitry, unless implementing a "soft processor" as described, does not execute program code. By comparison, a processor, e.g., PROC 210, implements a central processing unit that executes program code. Executing program code generally refers to executing instructions forming the program code using a program counter or the like. Programmable circuitry is programmed or configured prior to operation and the configuration data is not "executed" thereafter during operation unless the circuitry is being repurposed by the loading of different configuration data.

FIG. 2 is intended to illustrate an exemplary architecture that can be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the top of FIG. 2 are purely exemplary. In an actual IC, for example, more than one adjacent column of CLBs is typically included wherever the CLBs appear, to facilitate the efficient implementation of a user circuit design. The number of adjacent CLB columns, however, can vary with the overall size of the IC. Further, the size and/or positioning of blocks such as PROC 210 within the IC are for purposes of illustration only and are not intended as a limitation of the one or more embodiments disclosed within this specification.

Another type of programmable IC is a complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other types of programmable ICs are programmed by applying a processing layer, such as a metal layer, that programmably interconnects the various elements on the device. These programmable ICs are known as mask programmable devices. Programmable ICs can also be implemented in other ways, e.g., using fuse or antifuse technology. The phrase "programmable IC" can include, but is not limited to these devices and further can encompass devices that are only partially programmable. For example, one type of programmable IC includes a combination of hard-coded transistor logic and a programmable switch fabric that programmably interconnects the hard-coded transistor logic.

Figure 3:
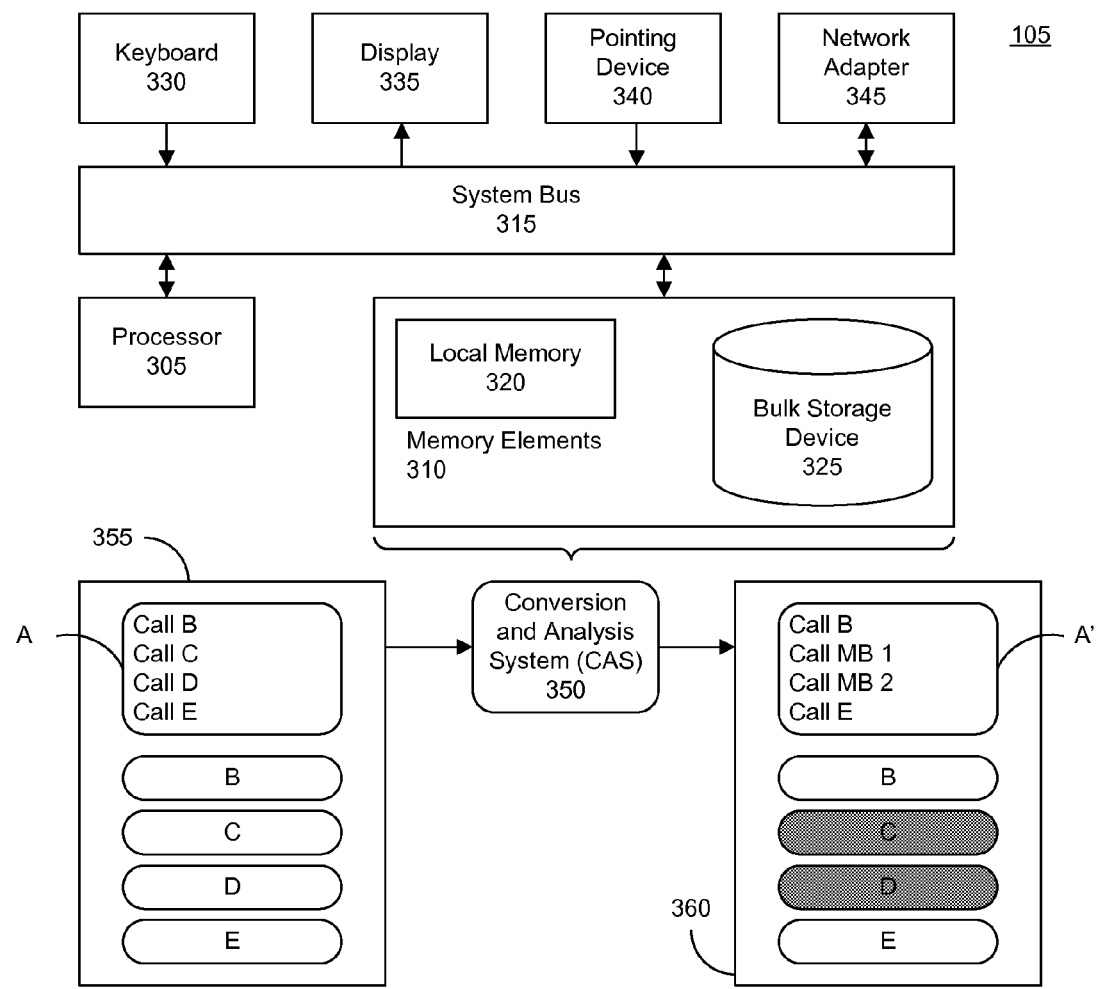
FIG. 3 is a block diagram illustrating an exemplary implementation of the host described with reference to FIG. 1.

FIG. 3 is a block diagram illustrating an exemplary implementation of host 105 of FIG. 1. Host 105 includes at least one processor 305 (e.g., a central processing unit or CPU) coupled to memory elements 310 through a system bus 315 or other suitable circuitry. As such, host 105 stores program code within memory elements 310. Processor 305 executes the program code accessed from memory elements 310 via system bus 315. In one aspect, for example, host 105 is implemented as a computer that is suitable for storing and/or executing program code. It should be appreciated, however, that host 105 can be implemented in the form of any system including a processor and memory that is capable of performing the functions described within this specification.

Memory elements 310 can include one or more physical memory devices such as, for example, local memory 320 and one or more bulk storage devices 325. Local memory 320 refers to random access memory or other non-persistent memory device(s) generally used during actual execution of the program code. Bulk storage device(s) 325 can be implemented as a hard drive or other persistent data storage device. Host 105 also can include one or more cache memories (not shown) that provide temporary storage of at least some program code in order to reduce the number of times program code must be retrieved from bulk storage device 325 during execution.

Input/output (I/O) devices such as a keyboard 330, a display 335, and a pointing device 340 optionally can be coupled to host 105. The I/O devices can be coupled to host 105 either directly or through intervening I/O controllers. A network adapter 345 also can be coupled to host 105 to enable host 105 to become coupled to other systems, computer systems, remote printers, and/or remote storage devices through intervening private or public networks. For example, host 105 can couple to a test platform as illustrated in FIG. 1 through network adapter 345. Modems, cable modems, and Ethernet cards are examples of different types of network adapters that can be used with host 105.

As pictured, memory elements 310 can store a Conversion and Analysis System (CAS) 350. CAS 350, being implemented as executable program code, can be executed by host 105. CAS 350, when executed, configures host 105 to communicate with IC 115 of FIG. 1 and perform the various performance analysis operations and emulation control functions described within this specification. Further, CAS 350, when executed, configures host 105 to process a design for an electronic system as described within this specification for emulation within IC 115. CAS 350, being implemented in the form of executable program code, is an integrated part of host 105. CAS 350 is a functional data structure that imparts functionality when employed as part of host 105. Designs 355 and 360 are functional data structures that impart functionality when employed as part of an IC as described within this specification.

Design 355 is a programmatic description of an electronic system to be emulated using a configurable hardware platform implemented within an IC. In one aspect, design 355 specifies an electronic system that is to be implemented within a programmable IC that includes a processor executing program code that interacts with one or more circuit modules. The processor can be implemented as a processor or processor subsystem as described herein with reference to FIG. 2. The circuit modules can be implemented as circuitry using the programmable circuitry of the IC.

In one aspect, design 355 is specified as program code. As such, design 355 includes one or more segments of program code illustrated as segment A, e.g., a main routine or kernel, a segment B, a segment C, a segment D, and a segment E. Design 355 can be specified in a high level language that, once compiled, is converted into a form that is executed or interpreted by a processor.

Within this specification, the term program code, in reference to a programming language, is not intended to encompass hardware description languages (HDLs) such as VHDL and/or Verilog that are used to express hardware in the form of circuitry. Rather, program code is intended to refer to instructions that are executed by a processor either directly or after application of one or more compilation steps.

As known, an HDL is a computer-language that facilitates the documentation, design, and manufacturing of a digital system, such as an IC. An HDL combines program verification techniques with expert system design methodologies. Using HDL, for example, a user can design and specify an electronic circuit, describe the operation of the circuit, and create tests to verify operation of the circuit. In general, HDL includes standard, text-based expressions of the spatial and temporal structure and behavior of the electronic system being modeled. HDL syntax and semantics include explicit notations for expressing concurrency. In contrast to other programming languages, e.g., high level programming languages or "program code" as used herein, HDL also includes an explicit notion of time, which is a primary attribute of a digital system.

Design 355 is a computer program written in a high level language such as the "C" programming language. Design 355 is specified as source code, which is a human readable form of program code that is not executable by a CPU or processor without compilation or some sort of transformation process being applied thereto. In general, design 355, once compiled, can be executed by a processor within the IC. One or more of the various segments B, C, D, and/or E, of design 355, however, can be selected for implementation in the form of a circuit module. When selected for implementation as a circuit module, the selected segment in the resulting design, as implemented within the IC, is implemented in the form of circuitry or hardware specifically configured to perform the same functions as the program code of the selected segment. In illustration, rather than executing segment B in the processor, the processor can offload the functionality otherwise implemented by segment B to circuitry, e.g., a circuit module, implemented within the programmable circuitry of the IC to perform the function of segment B.

In the early stages of system design, selecting the particular segment, or segments, of a design for an electronic system to implement as circuit modules can be problematic. While design 355 may be available, or at least partially written in terms of program code, hardware implementations (e.g., HDL) of the various segments B, C, D, and/or E are not designed. One cannot presume that efficiencies of a hardware implementation will be attainable simply through implementation of segment B, C, D, and/or E as a circuit module.

The performance of an electronic system can be measured in various ways. In one aspect, performance is quantifiable in terms of how fast the electronic system operates and/or how much time is required to perform particular tasks (i.e., speed of operation). In another aspect, performance is quantifiable in terms of power consumption. Accordingly, "performance," as used within this specification, is intended to refer to (1) speed of operation and (2) power consumption.

Referring to speed of operation, in many instances, implementation of segment B in the form of a circuit module carries an expectation of increased speed of operation as compared to executing segment B in the form of program code using a processor. Improved speed of operation may appear to be a virtual certainty when considering implementation of segment B in isolation. When segment B is viewed in the context of the entire electronic system, however, improved speed of operation is not a certainty. For example, the time required to setup the circuit module implementation of segment B in terms of the processor of the IC providing the circuit module with the necessary data input, subsequently receiving the result from the circuit module, and potential dependencies upon other circuit modules also serviced by the same processor may be so time consuming that much, if not all, of the benefit of the faster processing from the hardware implementation of the segment is lost. Further, effects within the electronic system such as network congestion also must be considered which can significantly reduce the speed of operation of the electronic system. Other unexpected or unpredictable behaviors also may occur within electronic systems that incorporate processors that may further degrade system performance.

Referring to power consumption, implementing segment B using a circuit module can result in the consumption of more or less power than had segment B been left to execute as program code by a processor. The unpredictable effects noted above as well as the amount of data to be moved between processor and circuit module also influence power consumption. As such, comparing power consumption of a program code implementation of segment B versus a circuit module implementation of segment B is difficult and is better evaluated from a system perspective.

Given the foregoing, selection of segments of a design as desirable candidates for implementation as circuit modules is not entirely clear. Emulation using a system such as emulation system 100 of FIG. 1 can alleviate this problem. Emulation using emulation system 100 provides for increased opportunity for design exploration in terms of identifying segments of design 355 for implementation as circuit modules. Accordingly, design 355 can undergo a transformation to design 360 by host 105. Host 105 can receive design 355 as an input and generate design 360 as output. As used herein, "outputting" and/or "output," in reference to a computing system, means storing in memory elements 310, writing to a file stored in memory elements 310, writing to display 335 or other peripheral output device, sending or transmitting to another system, exporting, or the like.

Both designs 355 and 360, for purposes of discussion, are specified in a high level language and as source code. As used herein, designation of program code as a high level language or being specified as a high level language means that the design is source code as opposed to a binary format or other format that is directly executable by a processor. Design 360 is an instrumented and, as such, modified version of design 355.

Within design 360, segment A has been transformed into segment A'. Within segment A', the call to segment C has been replaced with a call to, e.g., a driver that invokes, "MB 1," which is a portion of program code that can be configured to call a first IP modeling block, e.g., IP modeling block "MB 1." Similarly, the call to segment D has been replaced with a call to, e.g., a driver that invokes, "MB 2," which is a portion of program code that can be configured to call a second IP modeling block, e.g., IP modeling block "MB 2." As pictured, segments C and D in design 360 are shown with shading to indicate that each segment is no longer called or invoked from segment A'. It should be appreciated that segments C and D may still be included in design 360, but not called or otherwise invoked (executed). In another example, segments C and D can be removed from design 360.

The electronic system specified by design 360 can be emulated using emulation system 100 and, more particularly, using IC 115. Whereas the entirety of design 355, when compiled, executes on a processor within IC 115, e.g., PROC 210 of FIG. 2, only segments A, B, and E of design 360 execute on such a processor. The functions performed by segments C and D are replaced with drivers invoking IP modeling blocks implemented within the programmable circuitry of IC 115. Rather than developing the actual, detailed circuitry of the IP modeling blocks to perform the functionality of segments C and D, respectively, behavioral aspects expected from actual circuit module implementations performing the functions of segments C and D can be determined. Modeling data for each of segments C and D can be determined. The modeling data includes one or more parameters relating to speed of operation and one or more parameters relating to power consumption.

The modeling data for hardware implementations of segments C and D can be programmed into the IP modeling blocks implemented within the programmable circuitry of IC 115. In this manner, design 360, having an architecture in which segments C and D are implemented as circuitry rather than as executable program code, can be emulated. Other architectures in which other segments or combinations of segments are implemented using circuit modules also can be emulated.

Each IP modeling block can be programmed with modeling data referred to as a "performance profile." Each performance profile specifies behavioral characteristics for an IP modeling block. Each performance profile can include a first portion including one or more parameters indicating whether the IP modeling block behaves as a master or a slave. Each performance profile further can include a second portion including one or more parameters indicating speed of operation. For example, the second portion can specify a data traffic pattern to be generated as specified by a sequence of parameters implemented as instructions. Each performance profile further can include a third portion relating to power consumption. The third portion is referred to as a "power profile" from time-to-time within this specification.

For purposes of discussion, the power profile is considered part of the overall performance profile for an IP modeling block and includes one or more parameters indicating power consumption behavior.

The performance profile for an IP modeling block causes the IP modeling block to behave as expected from an actual implementation of the selected segments in the form of a circuit module. Accordingly, design 360, when compiled, is executed in part by a processor within the IC in which design 360 is emulated. Rather than invoking and executing segments C and/or D within the processor of the IC, segment A invokes IP modeling blocks MB 1 and MB 2 within the IC.

Rather than perform the exact functions of segments C and D, MB 1 and MB 2 generate data traffic patterns of hardware implementing the functionality of segment C and segment D. Further, MB1 and MB2 consume data that would otherwise be provided to segment C and segment D respectively. For example, MB 1 and MB 2 can receive data, incur processing delays, exhibit dependencies upon other IP modeling blocks, exhibit latencies, and output data in accordance with the expected behavior of actual hardware implementations of segment C and segment D. MB 1 and MB 2 can be physically similar or identical circuits that can be programmed with different modeling data to generate different data traffic patterns, e.g., where MB 1 emulates data traffic patterns of segment C and MB 2 emulates the data traffic patterns of segment D.

In the example described, since each IP modeling block effectively emulates the data traffic patterns of a segment of program code, the actual data that is exchanged between an IP modeling block and the processor during emulation need not be the actual or live data that would be used or generated for an actual circuit module implementation. The actual data may not be the same as the live data that would be generated in an actual system. For example, the content can be randomly generated data. The number of transactions, size of the transactions, and timing of the transactions, however, can track those of actual circuit module implementations thereby allowing a designer to determine likely performance of the architecture of the actual electronic system being emulated.

The modeling data programmed into an IP modeling block by way of the performance profile instructs the IP modeling block as to how much power is to be consumed. Each IP modeling block, for example, can include circuitry that is configurable to consume a variable amount of power as specified by the performance profile received by the IP modeling block. Thus, during emulation, the IP modeling block further consumes an amount of power that is specified, e.g., indirectly or directly, by the performance profile used. The power consumed by the IP modeling block is variable and dependent upon the performance profile.

In one aspect, test platform 110 in combination with host 105 is configured to measure power consumed by IC 115 as various architectures for the design are explored. Power consumed by IC 115, for example, can be measured by test platform 110 and provided to host 105 for storage and further processing to be described within this specification.

Figure 4:
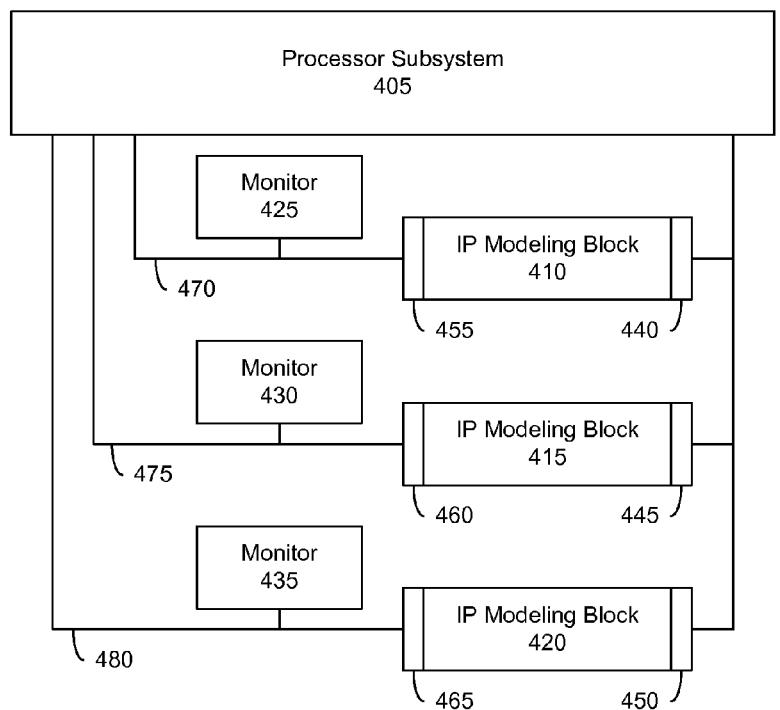
FIG. 4 is a block diagram illustrating an example of a configurable hardware platform.

FIG. 4 is a block diagram illustrating an example of a configurable hardware platform 400. Configurable hardware platform 400 can be implemented within an IC that includes programmable circuitry. For example, configurable hardware platform 400 can be implemented within a programmable IC as described with reference to FIG. 2. In illustration, a configuration bitstream specifying the circuitry pictured in FIG. 4 can be generated by the host and loaded into a programmable IC to implement configurable hardware platform 400 within the programmable IC. In one aspect, configurable hardware platform 400 is implemented in an IC formed of a single die. Configurable hardware platform 400 also can be implemented using a single bitstream to emulate any of a variety of different architectures for an electronic system to be implemented within a programmable IC.

As pictured, configurable hardware platform 400 can include a processor subsystem (processor) 405, one or more IP modeling blocks 410, 415, and 420, and one or more monitors 425, 430, and 435. It should be appreciated that the particular number of IP modeling blocks 410-420 and corresponding monitors 425-435 is provided for purposes of illustration only and is not intended to limit the examples disclosed within this specification. For instance, fewer or more IP modeling blocks and corresponding monitors can be included without limitation.

In general, each of IP modeling blocks 410-420 and monitors 425-435 can be implemented using programmable circuitry of the IC. Processor 405 can be implemented as a hard-wired processor. It should be appreciated, however, that processor 405 also can be implemented in the form of a soft-processor as described with reference to FIG. 2.

In one aspect, each of IP modeling blocks 410-420 can be implemented as similar or identical circuits and can be programmed to function as either a master or a slave with respect to processor 405. Each of IP modeling blocks 410-420 can include a first communication port (port) 440, 445, and 450, respectively that is coupled to processor 405. Each of IP modeling blocks 410-420 can include a second port 455, 460, and 465 that is also coupled to processor 405. Accordingly, processor 405 can have two independent interfaces to each of IP modeling blocks 410-420.

In one example, ports 440-450 are reserved for receiving modeling data in the form of performance profiles. Once configurable hardware platform 400 is implemented within an IC, processor 405 can send a performance profile to each of IP modeling blocks 410-420 via ports 440-450, respectively. As noted, each performance profile specifies one or more parameters in the form of values that are applied to adjustable settings within each of IP modeling blocks 410-420.

In one aspect, one or more or all of IP modeling blocks 410-420 are programmed to mimic the behavior of a particular segment of program code that is selected for hardware implementation (e.g., hardware acceleration) and which is to be emulated by an IP modeling block. In another aspect, one or more or all of IP modeling blocks 410-420 are programmed to mimic the behavior of a user specified type of circuit module. In any case, once programmed, an IP modeling block emulates, or models, the characteristics of the particular performance profile used to program the IP modeling block.

For each IP modeling block, the performance profile used to program the IP modeling block indicates whether the IP modeling block is a master or a slave to processor 405. The performance profile further specifies any of a variety of different data traffic patterns that are to be generated or consumed by a hardware implementation of the segment of program code modeled by the IP modeling block or a selected circuit module modeled by the IP modeling block. The IP modeling block can write data, e.g., generate traffic, and consume or read data, e.g., receive traffic, that would otherwise be generated or consumed by the segment of program code modeled by the IP modeling block or the user selected circuit module.

For example, the performance profile can specify one or more commands (parameters) for moving data between processor 405 and the IP modeling block. The various commands can include read commands, write commands, or a combination of read and write commands. Each respective read and/or write command can specify an amount of data that is to be read or written. Each read and/or write command also can specify a "delay" parameter that indicates the amount of time to wait before the IP modeling block is to implement the command after the prior command executes (e.g., after the prior transaction completes). In addition, each of the IP modeling blocks can be configured to implement a repeat, e.g., loop, mode. In the repeat mode, the same sequence of data traffic patterns, e.g., sequence of commands, can be repeated for a particular number of times as specified within the performance profile used to program the IP modeling block.

Accordingly, each of IP modeling blocks 410-420 can be programmed with a sequence of commands, as specified by the modeling data, allowing each of IP modeling blocks 410-420 to emulate various types of circuit modules. In one aspect, for example, the sequences of commands causes an IP modeling block to emulate a circuit module that is polled by processor 405. In another aspect, the sequences of commands allow an IP modeling block to emulate a circuit block that is interrupt driven, or the like. The sequences of commands also allow an IP modeling block to mimic various types of data transfers, including, direct memory access (DMA) transfers, memory copy transfers, or the like. In addition, the sequence of commands can create dependencies among individual ones of IP modeling blocks 410-420 and between one or more or each respective one of IP modeling blocks 410-420 and processor 405.

One example of a command sequence of a performance profile can cause an IP modeling block to emulate the following behavior: read in N bytes of data, take M cycles to process the data, and move P bytes of data out of the IP modeling block to processor 405. In this example, each of N, M, and P can be integer values. The IP modeling block, once programmed with a performance profile specifying the aforementioned commands, can read in N bytes of data sent from processor 405, wait M cycles, and generate P bytes of data that is sent to processor 405 during emulation of the larger electronic system.

In one aspect, the power profile portion of a performance profile can specify dynamic power consumption for the IP modeling block. For example, the power profile can specify a clock rate and/or a toggle rate to be implemented within the IP modeling block during emulation. In still another aspect, the traffic pattern generated by an IP modeling block can be considered part of the power profile since the data received or sent by each IP modeling block influences the power consumed by the IC. Each of the aforementioned attributes influences the amount of power consumed by the IP modeling block and the IC during emulation of an electronic system.

Ports 455-465 are reserved for use during emulation. For example, once emulation system 400 is implemented within an IC and each of IP modeling blocks 410-420 is programmed via ports 440-450 respectively, emulation can begin. Communications between processor 405 and each of IP modeling blocks 410-420 can be conducted via ports 455-465, respectively, during emulation. In one aspect, each of ports 455-465 can be implemented as a master/slave interface to communicate with processor 405 during emulation in accordance with the performance profile loaded within the IP modeling block.

Port 455 is coupled to processor 405 via communication link 470. Port 460 is coupled to processor 405 via communication link 475. Port 465 is coupled to processor 405 via communication link 480. In one aspect, each of communication links 470, 475, and 480 can be implemented as a bus or other suitable circuitry.

For example, processor 405 can include a plurality of AXI interfaces through which processor 405 communicates with IP modeling blocks 410-420. Communication links 470, 475, and 480 can couple to the AXI interfaces and communicate using the AXI protocol. In general, an AXI interface can be used to connect one or more AXI memory-mapped master devices to one or more memory-mapped slave devices. In one aspect, the AXI interfaces can conform to the AMBA® AXI version 4 specification from ARM® Holdings, including the AXI4-Lite control register interface subset. It should be appreciated, however, that AXI interfaces are provided for purposes of illustration only. In other examples, other varieties of interfaces and/or communication protocols suitable for communication between a circuit module and a processor can be used in place of, or in combination with, one or more AXI interfaces.

Monitors 425-435 can be coupled to communication link 470, 475, and 480, respectively, to measure various parameters during emulation. Monitors 425-435 can be configured to detect or identify information on communication links 470-480 such as, for example, timestamps of start and end times of address information, data, and IP modeling block execution (e.g., execution of a sequence or particular number of commands). In one aspect, this data can be exported to another system, e.g., the host coupled to the IC, for analysis.

In another aspect, monitors 425-435 can be configured to perform one or more computations to aggregate or summarize data detected on communication links 470-480. For example, monitors 425-435 can be configured to calculate delay and/or latency across the various communication links 470-480 with respect to IP modeling block operation. In further illustration, monitors 425-435 can calculate the amount of data carried on one or more of communication links 470-480, delays between sending and/or receiving a request from processor 405 to a particular one of IP modeling blocks 410-420, delays between sending a request to one of IP modeling blocks 410-420 and receiving a response from the IP modeling block, or the like.

While a plurality of individual monitors 425-435 are illustrated, the examples presented are not intended to be so limited. In other examples, rather than including a plurality of individual monitors 425-435, a single, larger monitor can be implemented. In that case, the monitor can be configured to detect activity as described upon each of communication links 470, 475, and 480. Such an embodiment can facilitate aggregation of data across IP modeling blocks 410-420.

In one example, monitor 425 can write data to a memory (not shown) within the IC in which configurable hardware platform 400 is implemented for downloading or analysis subsequent to emulation. In this regard, each of monitors 430-435 also can be configured to write data to such a memory. In another example, data collected by monitors 425-435 can be provided to an output port of the IC in which configurable hardware platform 400 is implemented for transmission to another system, e.g., the host as configured for data analysis.

As noted, the particular number of IP modeling blocks and corresponding monitors can vary according to need. The particular configuration bitstream that is loaded into the IC to implement configurable hardware platform 400 will define the particular number of IP modeling blocks implemented. In cases where fewer than the number of IP modeling blocks available within configurable hardware platform 400 are needed, unused IP modeling blocks within hardware configurable platform 400 can be programmed with accelerator programming data that effectively shuts down or deactivates the unused IP modeling block(s).

The modeling data, e.g., performance profiles, can be loaded into configurable hardware platform 400 via a communication port such as a JTAG port of the IC. Ports 440-450 of IP modeling blocks 410-420 can be coupled to a circuit element other than processor 405. For example, ports 440-450 can be coupled to a circuit element coupled to the JTAG port through which each of IP modeling blocks 410-420 can be programmed. In still another example, an application executing on the host can be used to program each of IP modeling blocks 410-420 through a communication port of the IC to which each of ports 440-450 is coupled. In such embodiments, processor 405 is not needed for purposes of programming, e.g., providing performance profiles, to each of IP modeling blocks 410-420.

Each of IP modeling blocks 410-420 can be programmed independently of the others. For example, one or more of IP modeling blocks 410-420 can be programmed using the same performance profile, e.g., when the particular segment of the design emulated by each IP modeling block has the same or similar expected performance. In that case, IP modeling blocks programmed the same will generate the same data traffic patterns and consume same or similar amounts of power. In another example, one or more or all of IP modeling blocks 410-420 can be programmed differently, i.e., using different performance profiles. In that case, since each of IP modeling blocks 410-420 is programmed differently, each will generate different data traffic patterns and/or can be configured to consume a different amount of power.

While not illustrated, in another aspect, one or more of IP modeling blocks 410-420 can be directly connected in order to communicate with one another without having communications traverse through processor 405. Direct connections facilitate the creation of dependencies between different ones of IP modeling blocks without utilizing processor 405 to effectuate such dependencies to emulate network behavior.

Figure 5:
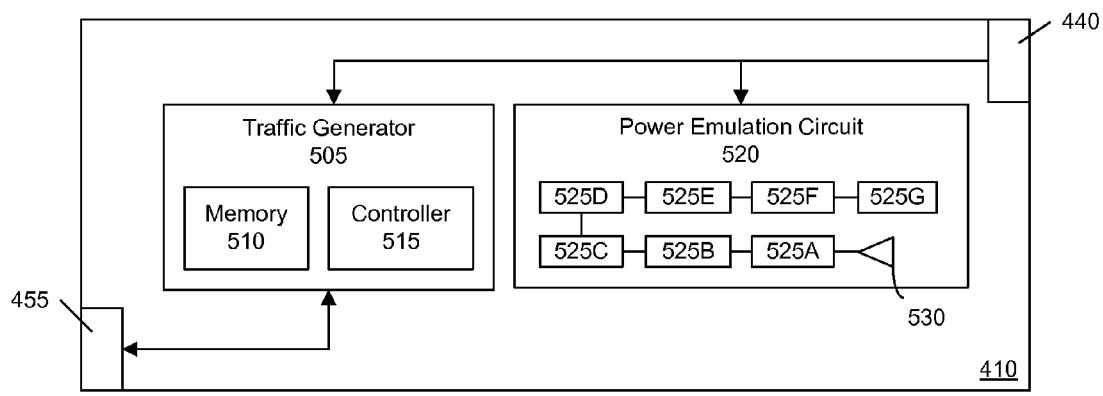
FIG. 5 is a block diagram illustrating an example of an intellectual property (IP) modeling block.

FIG. 5 is a block diagram illustrating an example of an IP modeling block. More particularly, FIG. 5 illustrates a more detailed illustration of IP modeling block 410 of FIG. 4. As discussed, each IP modeling block can be identical. Accordingly, the exemplary architecture illustrated in FIG. 5 can be used for each IP modeling block implemented within the configurable hardware platform provided by the programmable IC.

IP Modeling block 410 includes a traffic generator 505 and a power emulation circuit 520. Traffic generator 505 includes a memory 510 and a controller 515. Both traffic generator 505 and power emulation circuit 520 are coupled to port 440 through which modeling data in the form of a performance profile is received. Traffic generator 505 is also coupled to port 455 for receiving and sending traffic to processor 405 (not shown).

Traffic generator 505 is responsible for receiving data from processor 405 and for generating the traffic pattern from IP modeling block 410 described with reference to FIG. 4. In this regard, memory 510 can be implemented as a first-in-first-out type of memory suitable for storing data for transmission to processor 405. Controller 515 is coupled to memory 510 and is configured to execute any instructions for traffic generation received within the performance profile. In one example, controller 515 implements a state machine that is configured to generate traffic in accordance with instructions specified within a received performance profile.

In the pictured example, power emulation circuit 520 includes a chain of interconnected resources 525, which are individually represented as resources 525A-525G. The number of resources 525 that are active within the chain can be changed based upon the power profile of the performance profile received by the IP modeling block. In one example, power emulation circuit 520 is implemented to include a variable tap-off point. The tap-off point is adjusted to include a number of resources specified by the performance profile that is received. Resources 525 prior the tap-off point, for example, are active so that the tap-off point specifies the number of active resources 525. For example, the performance profile, when loaded into IP modeling block 410, sets the tap-off point between resources 525A and 525B, between resources 525B and 525C, between resources 525C and 525D, etc.

In this regard, IP modeling block 410 is configurable to consume an amount of power, e.g., a variable amount of power, as specified by the enumerated performance profile. A performance profile indicating that the IP modeling block is to consume a large amount of power will specify a tap-off point that is farther along the chain of resources 525 toward resource 525G, e.g., between resource 525F and 525G. A power profile indicating that the IP modeling block is to consume a lesser amount of power will specify a tap-off point closer to driving circuit 530, e.g., between resource 525B and resource 525C.

One example of resource 525 is a register. In another example, power emulation circuit 520 can include one or more other types of resources of the programmable IC such as BRAMs and/or DSPs. In one aspect, power emulation circuit 520 includes a homogeneous mix of resources, e.g., all registers, all BRAMs, or all DSPs. In that case, the performance profile of IP modeling block 410 can specify a number of resources that are to be enabled.

In another example, power emulation circuit 520 includes a heterogeneous mix of resources, e.g., a mixture of different resources. In that case, the performance profile of IP modeling block 410 can specify a type of resources and a number of each type of resources that are to be enabled, e.g., 1 BRAM and 2 DSPs, 2 BRAMs and 2 DSPs, etc. Accordingly, the particular type and number of resources, as specified by the performance profile loaded into IP modeling block 410, are enabled with the remainder being disabled.

The chain of resources 525 is driven by driving circuit 530. Driving circuit 530 is configured, via the performance profile, to generate data through the chain of resources up to the tap-off point at a designated toggle rate. As known, the toggle rate of a circuit is determined according the frequency with which circuit elements, e.g., resources 525, change stages from either a low (e.g., a logic zero) to a high (e.g., a logic one) or from a logic high to a logic low. Driving circuit 530 can generate the data to be clocked through power emulation circuit 520 to match the particular toggle rate specified in the performance profile provided to IP modeling block 410.

In one or more of the examples illustrated, the user or designer that is emulating the electronic system is provided with a high degree of configurability with respect to modeling power consumption. The user can specify the number and/or type of resources available within the IP modeling block that are enabled, a particular toggle rate, traffic generation, etc.

In still another example, the manner in which the performance profile is specified can be simplified. In illustration, the user can be provided with one or more sample performance profiles for different circuit modules. The user can choose from among one or more of the sample performance profiles that are intended to emulate particular circuit module types such a Fast Fourier Transform (FFT) generator, a filter, a DA converter, or the like.

The user can select an FFT generator and specify whether the circuit module is intended to be a high performance circuit module, a medium performance circuit module, or a low performance circuit module. In another example, the user can specify whether the selected type of circuit module is to emulate high power consumption, medium power consumption, or low power consumption. In such cases the user is effectively selecting from pre-configured performance profiles that specify data traffic patterns, which circuit resources are active and which are not, and/or the toggle rate to be used.

While power emulation circuit 520 is configurable to consume a particular amount of power as described within this specification, it should be appreciated that power emulation circuit 520 and traffic generator 505 can be viewed as generating an amount of power in combination. The amount of power consumed by IP modeling block 410 can be varied by programming power emulation circuit 520 as described. The amount of data consumed and sent by traffic generator 505, however, also contributes to the power consumption of IP modeling block 410 and the IC as a whole. For example, data that is sent from traffic generator 505 or received by traffic generator 505 is carried over the particular, e.g., same, interconnects that would be used in an actual implementation of the electronic system being emulated. Thus, port 455 is consuming power in addition to the various signal paths linking IP modeling block 410 with processor 405, other IP modeling blocks, or other circuits. As such, power emulation circuit 520 adds to the power emulation already provided by traffic generator 505 and the various signal paths and ports used.

In another aspect, traffic generator 505 can be configured, e.g., programmed, to perform stateful traffic generation. For example, traffic generator 505 can be configured to generate and send data via port 455 according to, or in a manner that depends upon, the data that is received by IP modeling block 410. This allows IP modeling block 410 to respond to received data in one of several different ways based upon the data that is received. Again, the data is not actual live data, but rather can be random data that includes one or more data items or instructions therein.

In illustration, consider an implementation of IP modeling block 410 that includes one or more registers. The registers can be included within traffic generator 505 and/or within controller 515. In the case where IP modeling block 410 is intended to emulate a particular type of IP, e.g., an FFT from an IP library, IP modeling block 410 can include one or more registers that correspond to the registers available in the actual FFT (e.g., the particular IP) that is emulated by IP modeling block 410.

For example, the registers within IP modeling block 410 emulate direct memory access (DMA) control registers implementing a memory map. Traffic generator 505 and, more particularly, controller 515, can monitor for instructions within data received from port 455 that write to the registers. Responsive to writing to a particular register and/or a particular value to a particular register within IP modeling block 410, controller 515 can initiate a behavior that emulates the behavior of writing to the actual register of the particular IP emulated by IP modeling block 410. Controller 515 can respond, e.g., by generating a particular or different traffic pattern, writing data and an amount of data, or the like out of port 455 that emulates the expected behavior of the FFT were one to write to the register of the FFT that is emulated by the register of IP modeling block 410 that was written.

In illustration, consider the case in which the actual IP that is emulated by IP modeling block 410 has an operational mode that allows the IP to burst data with a length of eight bytes or 64 bytes. The value written to the register determines the burst length. IP modeling block 410 can be implemented in a manner that includes a register that can be written with data. Depending upon the data written to the register, IP modeling block 410 bursts data with a length of either eight bytes or 64 bytes. The register can be written responsive to data and/or instructions received via port 455 during emulation and, as such, changed during emulation to burst either eight bytes or 64 bytes as the case may be. The data that is burst, however, can be randomly generated data.

Figure 6:
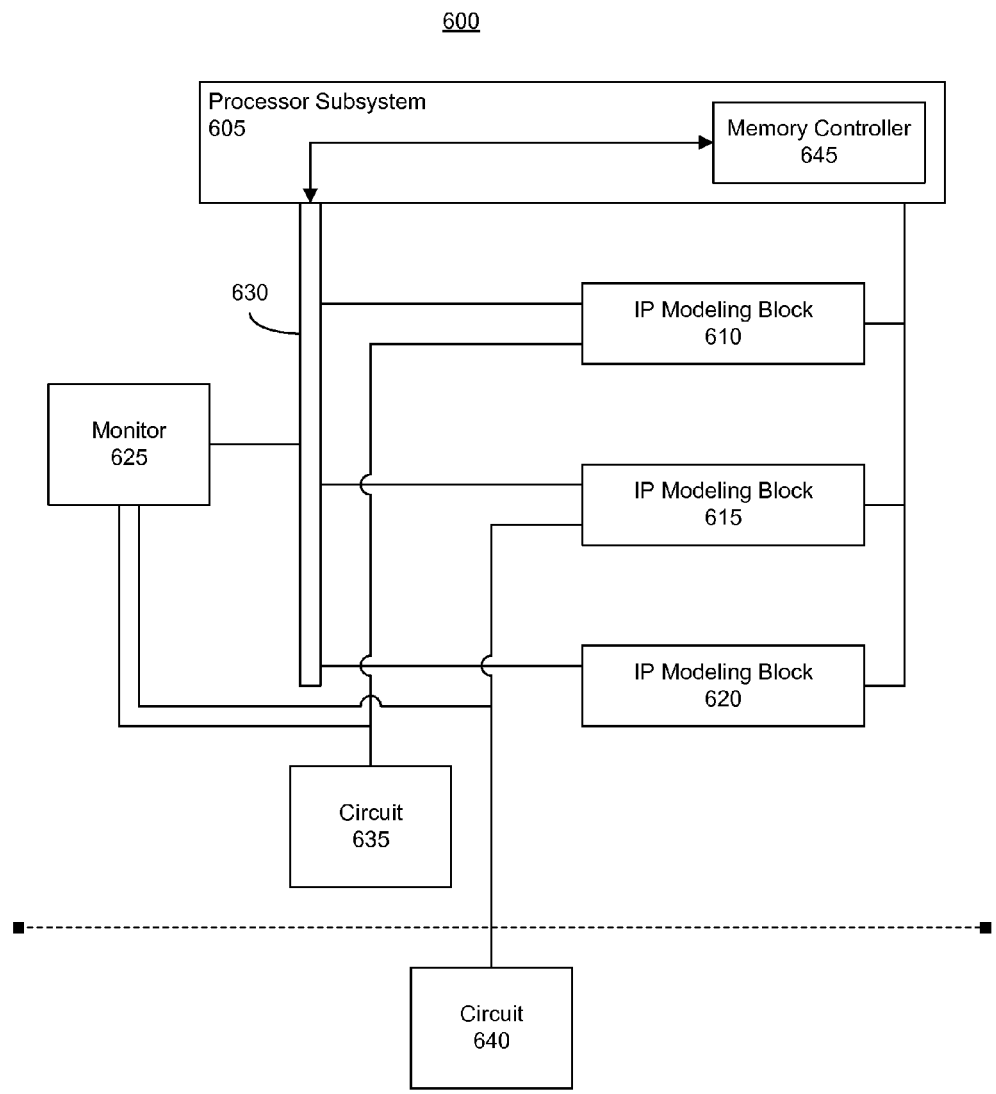
FIG. 6 is a block diagram illustrating another example of a configurable hardware platform.

FIG. 6 is a block diagram illustrating another example of a configurable hardware platform 600. Configurable hardware platform 600 can be implemented within an IC having programmable circuitry as described within this specification. Configurable hardware platform 600 can include a processor subsystem (processor) 605, one or more IP modeling blocks 610, 615, and 620, and a monitor 625. Configurable hardware platform 600 can be implemented substantially similar to configurable hardware platform 400 of FIG. 4. FIG. 6, however, illustrates an example in which a single monitor 625 is utilized. Particular details such as the ports of IP modeling blocks 610-620 are not shown.

Configurable hardware platform 600 illustrates that each of IP modeling blocks 610-620 communicates with processor 605 and with one another via a bus 630. As shown, each of IP modeling blocks 610-620 is coupled to bus 630. Likewise, processor 605 is coupled to bus 630. As such, each IP modeling block can communicate with each other IP modeling block via bus 630 and with processor 605. Monitor 625 can be configured to monitor the various transactions, as previously described, that occur over bus 630. In one aspect, when implemented as shown in FIG. 6, the various commands that can be used to program IP modeling blocks 610-620 also can specify destination information so that data can be directed to one or more other particular IP modeling blocks in addition to, or in lieu of, processor 605.

In addition, FIG. 6 illustrates that one or more IP modeling blocks can be coupled to circuit blocks other than processor 605 and other IP modeling blocks. In the example shown in FIG. 6, IP modeling block 610 is coupled to circuit 635. Circuit 635 can be a circuit implemented within the IC in which configurable hardware platform 600 is implemented. For example, circuit 635 can represent a RAM or other subsystem. As shown, monitor 625 can be coupled to the communication link between IP modeling block 610 and circuit 635. Accordingly, monitor 625 can detect transactions that take place between IP modeling block 610 and circuit 635. It should be appreciated that circuit 635 can be incorporated into configurable hardware platform 600 by connecting circuit 635 to bus 630 in lieu of providing a separate and dedicated connection as shown.

In another aspect, one or more IP modeling blocks can be coupled to circuits that are external to the IC in which configurable hardware platform 600 is implemented. The dashed line between circuit 635 and circuit 640 illustrates a physical boundary of the IC in which configurable hardware platform 600 is implemented. In the example pictured in FIG. 6, IP modeling block 615 is coupled to circuit 640. Circuit 640 can represent any of a variety of other systems and/or circuits that can reside external to the IC in which configurable hardware platform 600 is implemented. For example, circuit 640 can represent a controller, another processor, a RAM, or the like. It should be appreciated that communication with a system such as circuit 640 that resides external to configurable hardware platform 600 can be performed through one or more of the I/O blocks or interfaces described with reference to FIG. 2. As shown, monitor 625 can be coupled to the communication link between IP modeling block 615 and circuit 640 within the IC so as to detect transactions that occur via the communication link.

In still another aspect, one or more IP modeling blocks can be coupled to a circuit or system external to the IC in which configurable hardware platform 600 is implemented through one or more controllers within processor 605. For example, as shown, processor 605 includes a memory controller 645. Memory controller 645 is implemented as a hardwired circuit block within processor 605. One or more of IP modeling blocks 610-620 can be configured to communicate with memory controller 645 to emulate communications with a circuit block or system such as a RAM that exists external to the IC.

The architecture shown in FIG. 6 is presented for purposes of illustration only and is not intended to limit the examples disclosed within this specification. Other variations of configurable hardware platform 600 can be implemented. For example, rather than using bus 630 to facilitate communication between IP modeling blocks 610-620, one or more of IP modeling blocks 610-620 can be communicatively linked via a bus that is separate and independent of the bus through which each of IP modeling blocks 610-620 communicates with processor 605. One or more monitors can be configured to detect transactions occurring over each such bus.

In another example, one or more or all of IP modeling blocks 610-620 can be coupled together via a series of individual communication links that couple selected ones, e.g., selected pairs or combinations of pairs, of the IP modeling blocks. For instance, direct connections such as AXI, switched point-to-point type of connections can be used to couple selected ones of IP modeling blocks 610-620 together for direct communication with one another. IP modeling block 610 can be directly coupled to IP modeling block 615 and/or directly coupled to IP modeling block 620, for example. Similarly, IP modeling block 620 can be directly coupled to IP modeling block 615. In such an embodiment, IP modeling blocks 610-620 can be communicatively linked with processor 605 as shown in FIG. 6 or communicatively linked with processor 605 as illustrated in FIG. 4 using separate communication links. Regardless of the particular configuration, one or more monitors, as described, can be coupled to the communication links that directly couple IP modeling blocks and the communication links that couple the IP modeling blocks with the processor in order to detect transactions taking place over the respective communication links.

It should be appreciated that the particular communication links established between IP modeling blocks, the processor, external circuits, and the like, despite the particular architecture used (e.g., configurable hardware platform 400 or configurable hardware platform 600) accurately emulate power dissipation of the architecture of an electronic system to be emulated in that the same or actual communication link circuitry within the IC is used within the configurable hardware platform that would be used in implementing the actual electronic system being emulated. For example, an IP modeling block accesses the actual memory controller 645 that would be used were a circuit module to access a RAM within a functioning system. In this manner, the power consumption of the configurable hardware platform during emulation more closely tracks the power consumption of the actual electronic system being emulated.

Figure 7:
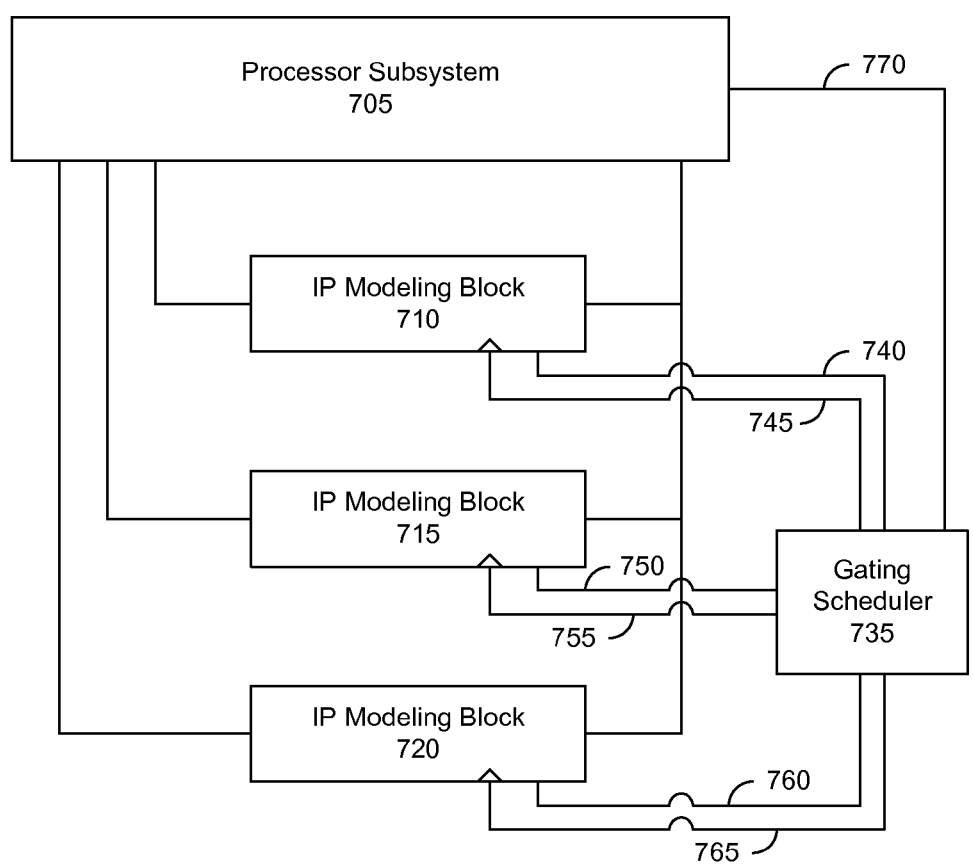
FIG. 7 is a block diagram illustrating another example of a configurable hardware platform.

FIG. 7 is a block diagram illustrating another example of a configurable hardware platform 700. Configurable hardware platform 700 can be implemented within an IC having programmable circuitry as described within this specification. Configurable hardware platform 700 can include a processor subsystem (processor) 705, one or more IP modeling blocks 710, 715, and 720, and a gating scheduler 735. Configurable hardware platform 700 can be implemented substantially similar to configurable hardware platform 400 of FIG. 4. In this regard, while not illustrated, port circuitry and monitor circuitry are included. Further, while illustrated with each of IP modeling blocks 710-720 having its own connection to processor 705, configurable hardware platform 700 can be implemented using a bus as described with reference to FIG. 6.

Configurable hardware platform 700 includes a gating scheduler 735. In the example pictured, gating scheduler 735 is a circuit block that is implemented using the programmable circuitry of the IC. As shown, gating scheduler 735 is configured to provide a clock signal and a power signal to each of IP modeling blocks 710-715. As shown, gating scheduler 735 provides power signal 740 and clock signal 745 to IP modeling block 710. Gating scheduler 735 provides power signal 750 and clock signal 755 to IP modeling block 715. Gating scheduler 735 provides power signal 760 and clock signal 765 to IP modeling block 720. In another example, gating scheduler 735 is configured to provide only clock signals to each IP modeling block. In still another example, gating scheduler 735 is configured to provide only power signals to each IP modeling block.

In one example, gating scheduler 735 is controlled by processor 705 via signal 770 to place one or more or all of IP modeling blocks 710-720 to sleep. In one aspect, gating scheduler 735 can put one or more or all of IP modeling blocks 710-720 to sleep by gating, e.g., holding constant at a low or high, any one or more or all of clock signals 745, 755, and/or 765 according to instructions received from processor 705. IP modeling blocks 710-720 can be put to sleep independently of one another. The host can receive one or more user inputs specifying a gating schedule for the IP modeling blocks that is converted into program code executable by processor 705 for controlling gating scheduler 735 during emulation.

In another example, gating scheduler 735 is controlled via the host. Commands can be received from the host, e.g., by way of processor 705, which then controls gating scheduler 735. In another arrangement (not shown), commands from the host can be received by another circuit block, e.g., a JTAG circuit block, that communicates with gating scheduler 735. This allows a designer to manually control gating scheduler 735 in real time during emulation. As used herein, the phrase "real time" means a level of processing responsiveness that a user or system senses as sufficiently immediate for a particular process or determination to be made, or that enables the processor to keep up with some external process.

In still another example, gating scheduler 735 is loaded with a gating schedule that is implemented by gating scheduler 735 during emulation. The gating schedule can be loaded during emulation or at the start of emulation from the host. In this manner, gating scheduler 735 can control IP modeling blocks without reliance upon the host and/or processor 705 during emulation.

In another aspect, gating scheduler 735 can put IP modeling blocks 710-720 to sleep by disconnecting one or more or all of IP modeling blocks 710-720 from power provided by power signals 740, 750, and 760 respectively. For example, gating scheduler 735 can be configured to reduce or remove the voltage applied to each of power signals 740, 750, and 760, thereby removing power from IP modeling blocks 710-720 and placing each to sleep.

While gating the clock signal for an IP modeling block accurately models a reduction in dynamic power, disconnecting or terminating power to an IP modeling block can accurately emulate a reduction in static power. In one aspect, IP modeling blocks, e.g., IP modeling blocks 710-720 (or more), can be allocated to different groups referred to as "power islands." A power island is a collection of one or more IP modeling blocks emulating circuit modules that are controlled in terms of power management in a same way. The IP modeling blocks of a same power island are enabled and disabled as a group. Different power islands are independently controlled. By disabling the various IP modeling blocks of different power islands (whether by clock gating or disconnecting power) during emulation, the power consumption (static, dynamic, and/or both) can be determined for that power island. The host can record power consumption results of the IC in which configurable hardware system 700 is implemented as various IP modeling blocks, or groups thereof, are disabled.

As an example, consider the case in which IP modeling block 710 is assigned to a first power island. IP modeling blocks 715 and 720 are assigned to a second power island. The first and second power islands correspond to, e.g., emulate, actual power islands of the electronic system being implemented. More particularly, the circuit module of the electronic system that is emulated by IP modeling block 710 belongs to the first power island. The circuit modules of the electronic system emulated by IP modeling blocks 715 and 720 belong to the second power island. The gating schedule implemented within processor 705 and executed by gating scheduler 735 allows the first and the second power islands to be turned on and off during the emulation to determine the effect of such power islands on power consumption and energy usage by the electronic system. The emulation also allows a system designer to emulate the actual effect of assigning particular circuit modules (IP modeling blocks) to particular power islands as the number of power islands available in the target IC may be limited and/or restricted. IP modeling blocks can be assigned to different power islands during emulation.

Using the power island configuration above, the resulting configurable hardware platform allows one to power down the first power island, e.g., IP modeling block 710, for a predetermined time period, e.g., 20 minutes, during the emulation. In consequence of having fewer active circuit modules, the overall temperature of the IC likely will be reduced as emulation continues with IP modeling block 710 disabled. By taking power consumption measurements while IP modeling block 710 is active and then after IP modeling block has been inactive, e.g., disabled for the predetermined period of time, the system designer can evaluate the effect of enabling and/or disabling a circuit module (the actual circuit module emulated by IP modeling block 710) on static power consumption of the IC in consequence of the changing temperature of the IC.

Figure 8:
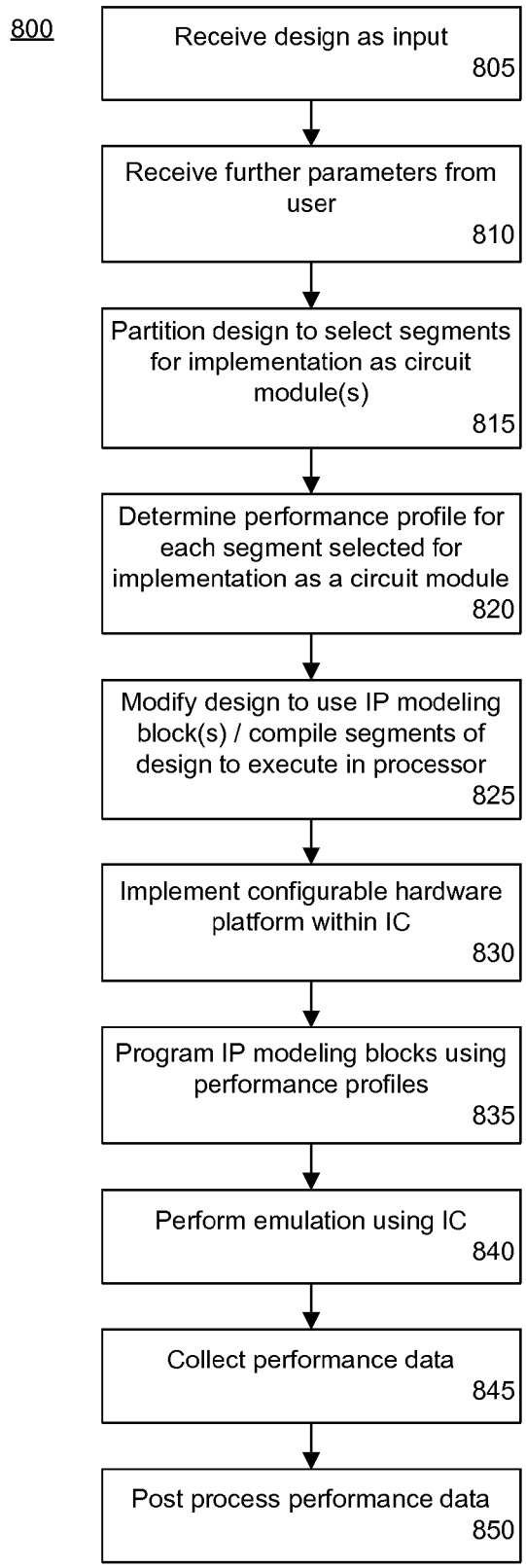
FIG. 8 is a flow chart illustrating an exemplary method of estimating performance of an electronic system.

FIG. 8 is a flow chart illustrating an exemplary method 800 of estimating performance of an electronic system. Method 800 can be performed, at least in part, by a system as described with reference to FIGS. 1 and 3 of this specification, e.g., a host executing CAS 350.

Accordingly, method 800 can begin in block 805 where the host receives a design as input for processing. For example, a designer can load or otherwise provide program code specified as a high level language including one or more segments that define or specify an electronic system that is to be emulated using a configurable hardware platform within an IC coupled to the host as described with reference to FIG. 1.

In block 810, the host optionally receives one or more user inputs specifying additional parameters for the configurable hardware platform. For example, the user can provide or specify, by way of one or more user inputs to the host, the number of IP modeling blocks to be included within the configurable hardware platform, a predetermined performance profile for one or more IP modeling blocks, a number of I/Os of the IC that are to be used, specific parameters of performance profiles, or the like. The number of I/Os can include, for example, the number of transceiver blocks (MGTs) of the IC that are to be used, etc.

In block 815, one or more segments of the design can be selected for implementation as a circuit module. Block 815 is also referred to as "partitioning" the circuit design. As used within this specification, the term "partitioning" refers to the process of selecting and/or designating particular segment(s) of the design to be implemented as circuit modules. When selected for implementation as a circuit module, the segment is selected for emulation using an IP modeling block when emulating the electronic design using the configurable hardware platform.

In one aspect, the particular segments of the design that are selected can be specified via a user specified input. The user, working through a user interface provided by the host, can designate particular segments of the design that are to be implemented as circuit modules. User inputs can be received that select one or more segments during block 810, for example. Responsive to the user input, the host can select each segment specified by the user input as a candidate for implementation as a circuit module and, as such, emulation using an IP modeling block.

In another aspect, the host and, more particularly, CAS 350, includes one or more different compilers. Each compiler can perform an analysis upon the design in accordance with the particular mandate of that compiler. For example, one compiler can be a conventional compiler such as an LLVM-GCC compiler, which is a version of a gcc compiler that compiles C/ObjC programs into one of a plurality of different formats according to the options selected. Another compiler can be one that operates according to OpenCL. Two compilers are described for purposes of illustration. It should be appreciated, however, that more than two compilers can be included and operate upon the design. Each of the compilers can operate in parallel upon the design. In an alternative implementation, the compilers can operate serially on the design.

Output from each compiler is evaluated to generate data flows for the design. A data flow refers to one or more parameters that define way in which data flows through a segment. In one example, a data flow defines an amount of data provided to a segment as an input, an amount of data provided as an output from a segment, a direction of data in terms of the source and destination segments for data. Latency between segments also can be determined as part of the data flow. A data flow further can include, or specify, the amount of time a segment requires for processing data, e.g., the time between receiving an input and sending an output in response to the input. Further detail relating to the determination of data flows is provided with reference to FIGS. 10-12 of this specification.

Continuing with this example, one or more segments can be selected for emulation using an IP modeling block based upon the data flows that are determined. In illustration, one or more thresholds can be specified for data flows within the host. A segment that has a data flow into and/or out of the segment that does not exceed a threshold can be selected. In another illustration, a threshold can be specified within the host for latency. One or more segments having a latency below the threshold can be selected.

In another aspect, one or more IP blocks or cores also can be emulated. For example, a user may wish to incorporate an IP block such as a core or the like from a third party vendor. In that case, the IP block, like a segment of program code of the design, can be represented in the design using a segment. The segment can include a reference or other indicator that the segment is a proxy for the IP block. For example, in one aspect, the segment need not include program code that is executable, but rather include information that can be interpreted or compiled by the host to indicate that the segment is to be hardware emulated using an IP modeling block. The indicator can be any of a variety of codes, characters, and/or symbols that can be located in a comment line or the like. Upon detecting the indicator, the segment, whether including actual program code or serving as a placeholder for an IP block or core, can be designated as a candidate for implementation as a circuit module.

In block 820, the host determines a performance profile for each segment of the design that is selected for implementation as a circuit module and emulation using an IP modeling block. As noted, the performance profile includes values for one or more different parameters that, when programmed into an IP modeling block, cause the IP modeling block to emulate the behavior of a hardware, e.g., a circuit module, implementation of a particular segment of the design. In one aspect, the host generates the performance profile from the data flows calculated in block 815.

In one example, the traffic pattern that is developed for an IP modeling block is determined or derived from an analysis of the data flow for the segment the IP modeling block is to implement through emulation. The host can profile each segment of the design selected for implementation in hardware. In profiling the various segments of the design, the host determines one or more parameters of the data flow, also referred to as execution attributes of the segment, which include, but are not limited to, the number of processing cycles needed for the segment to execute, the latency in executing, the amount of data that is consumed by the segment as input when executed, the amount of data that is generated and output by the segment responsive to execution, the read address intervals, the write address intervals, and the like.

In general, a write address interval and a read address interval each refer to a data interval, for a write operation or a read operation respectively. A data interval specifies the total amount of time a burst of data is to occur. The total amount of time is measured from the beginning of the burst of data to the end of the burst of data. In illustration, a burst of data typically includes multiple "beats" of a data transfer. A "beat" can refer to one word or portion of data that is transferred per clock cycle for a particular number, e.g., 256, of clock cycles. The first beat represents or signifies the beginning of the data interval (e.g., the data transfer) and the last beat signifies the end of the data interval.

The host can evaluate data transfers of the design, e.g., the high-level program code, and determine a likely translation in terms of data intervals for the IP modeling blocks. Such data intervals do not account for congestion within the emulation system. Rather, the data intervals serve as estimates of how data exchanged in the high-level program code of the design will translate into transactions in the configurable hardware platform, e.g., between the processor and an IP modeling block.

For example, the host can determine a data flow which can include, in part, calculating a quantity of data provided as an input to a selected segment and a quantity of data provided as an output from the selected segment. The host calculates a parameter of the performance profile for the segment from the quantity of data provided as an input or the quantity of data provided as an output. The parameters of a performance profile, as noted, can include the instructions previously described that determine traffic patterns generated by the IP modeling block into which the performance profile is loaded.

In another example, the host can determine a data flow in part by calculating an amount of time for the circuit module implementation of the first segment to generate an output responsive to receiving an input. The host calculates a parameter of the performance profile representing that amount of time. The parameter is used during emulation, for example, to control the amount of time required for the IP modeling block to generate a result and, thus, specifies the amount of time that the IP modeling block waits responsive to receiving an input before sending an output.

In cases where the segment includes no programming code, insufficient programming code for the type of analysis described herein to determine execution attributes, or based upon user preference, the data needed to generate the traffic pattern for the IP modeling block corresponding to the segment can be specified or determined through other techniques. For example, the user can provide the traffic pattern since the modeling data cannot be derived from the segment itself. The user, for instance, can include a reference to the modeling data specifying the traffic pattern within the segment, select a predetermined data traffic profile, include the modeling data within the segment itself along with indicators that the segment includes such data, for example, in lieu of program code, or otherwise specify the modeling data to the system processing the design.

In another aspect, the execution attributes of a candidate segment can be compared with one or more profiles of various circuit types. Each profile can be specified in the form of modeling data. The execution attributes, e.g., a data flow, can be correlated with the profiles to determine a match or best match. For example, various types of known and actual circuits such as matrix multipliers of a specified size, DSPs, FFT generators, filters, and the like can be profiled to develop modeling data for various sizes, configurations, and the like to mimic the behavior of various permutations of the known circuits. The execution attributes of the candidate segment can be compared with the profiles. The modeling data for the profile that matches, or most closely matches the attributes of the candidate segment can be selected for loading into the IP modeling block.

In still another aspect, a system designer can manually determine or otherwise specify the particular behavioral characteristics that are desired for an IP modeling block that is replacing the candidate segment. The system designer can utilize a software based tool executing within the system to specify the modeling data. Alternatively, a system designer can select from among a plurality of profiles as described above, e.g., to program an IP modeling block to emulate a matrix multiplier, a DSP unit, an FFT generator, a particular filter type, or the like.

As part of the performance profile, the host can determine a power profile for each segment selected for implementation as a circuit module. In one example, the host can receive user inputs specifying the power profile for each IP modeling block within the configurable hardware platform. The power profile can be specified in any of a variety of different ways as previously described within this specification. For example, the power profile for each segment selected for implementation as a circuit module can be specified through a user interface provided by the host system allowing the user to select a power profile or specify attributes of the power profile with varying granularity. In another example, the power profile of a segment can be specified within the segment itself using any of the techniques described with reference to block 820 and the traffic patterns.

In illustration, quantities such as the amount of data that is transferred each time a portion of program code, the number of operations performed in the called portion of program code, the types of operations performed, etc., each can be translated into a parameter of a power profile. Each of these quantities, for example, can be translated or adjusted into a toggle rate or used within a formulation to determine a toggle rate. Providing a large amount of data to the segment will translate to a higher toggle rate than a lower amount of data. Similarly, a larger number of operations translates into longer chain of active resources within the power emulation circuit (e.g., circuit 520) than would a lower number of operations. The number of operations, for example, determines the location of the tap-off point in the chain so that the tap-off point is moved closer to the end of the chain for more active resources than closer to the beginning which means fewer active resources. As noted, a longer chain of active devices means that the tap-off point is set closer to the end of the chain of resources. A more complex operation such as multiplication will translate into a larger number of active resources in the power emulation circuit than would a less complex operation such as addition or subtraction. A more complex operation further can translate into activating larger resources, e.g., DSPs, rather than activating smaller resources such as registers. In still another example, the number of states for the called program code as determined by an analysis of the available control states of the control state machine or finite state machine implemented by the program code can be used as a measure of design complexity and, as such, determine the number of active resources within the power emulation circuit. A larger number of states translates into more active devices than would a smaller number of states.

In another example, as part of block 820, the host can generate an HDL version of the segment. From the HDL version of the segment, various hardware attributes including, but not limited to, a number of parallel processing channels (also referred to as "pipelines") specified by the HDL version of the segment, the number of stages in each parallel processing channel, or the like are determined. One or more parameters of the power profile, also referred to as power parameters of the performance profile, can be calculated from the parallel channel data, the number of stages in each parallel channel, or the like. For instance, the number of pipelines, the number of stages in each pipeline, or a combination of both can be translated into a toggle rate and/or a tap-off point for the power emulation circuit.

In block 825, the host modifies the design to utilize an IP modeling block in lieu of executing each segment selected for hardware emulation. The host further compiles segments of the design that are to be executed by the processor into executable program code, e.g., a binary file. In one aspect, the host automatically replaces the selected segments with hardware models. For example, the host can instrument the program code of the design with program code that invokes the IP modeling block intended to emulate a circuit module implementation of the selected segment instead of actually executing the segment within the processor of the configurable hardware platform during emulation.

Instrumenting the design refers to inserting program code, e.g., a driver, that allows the processor of the design to communicate and interact with an IP modeling block emulating a circuit module implementation of a segment selected for hardware implementation. The program code inserted into the design, e.g., the driver, when executed, causes the processor to provide data as input to the IP modeling block, receive data output from the IP modeling block, or the like.

In illustration, each call that invokes a selected segment can be replaced by the host with a driver that includes a call to the IP modeling block used in place of the segment. It should be appreciated that each segment of the design selected for implementation as a circuit module is processed in this manner. Accordingly, one IP modeling block is called for each of the selected segments, thereby maintaining a one-to-one relationship between IP modeling blocks of the configurable hardware platform and selected segments of the design.

In block 830, the host can implement the configurable hardware platform within the IC. For example, the host generates a configuration bitstream that is used to program the IC to implement the configurable hardware platform therein. The bitstream specifies the configurable hardware platform having the required number of IP modeling blocks. Once the configuration bitstream is generated, the host can send the configuration bitstream to the IC. The IC can load the configuration bitstream, thereby implementing the configurable hardware platform therein.

It should be appreciated that as part of the IC configuration process, the modified version of the design, e.g., the version that invokes IP modeling blocks in lieu of executing the selected segments, can be loaded into the processor of the IC. Thus, the modified design, e.g., the user specified system design that includes calls to the IP modeling blocks in lieu of calling and executing segments selected for implementation as circuit modules, is loaded into the processor of the IC as part of loading the configuration bitstream.

In block 835, the system can program the IP modeling blocks of the configurable hardware platform within the IC. Each IP modeling block involved in the emulation can be programmed with the appropriate performance profile specifying the modeling data needed for that IP modeling block to emulate the segment associated with the IP modeling block. Each IP modeling block can be programmed with a performance profile specific to that IP modeling block, thereby allowing each IP modeling block to be programmed independently of the others. The performance profile specifies the traffic pattern to be generated by the IP modeling block as well as the power profile to be implemented by the IP modeling block during emulation.

In one aspect, the performance profile can be provided to the IC by the host. For example, the host can provide the performance profile to the processor after the configurable hardware platform is implemented within the IC. The processor then can program each IP modeling block by providing the performance profile to each respective IP modeling block. In another aspect, the performance profile can be provided to the IC via JTAG or other suitable communication port and loaded into each IP modeling block without utilizing the processor of the IC.

In block 840, the host can initiate emulation within the IC. For example, the host can instruct the configurable hardware platform to begin emulation. Accordingly, the configurable hardware platform can begin to operate. The processor of the configurable hardware platform, for example, can begin executing the executable portions of the design and invoking the various ones of the IP modeling blocks programmed to emulate actual hardware versions of the selected segments, generate data traffic patterns, and implement the power profiles as described.

In block 850, the host can collect various types of performance data for the IC. In one aspect, host obtains data collected by the monitor(s) of the emulation. Data collected by the monitors reflects the performance of the particular architecture being emulated within the emulation system. The data that is collected, as noted, can indicate the interactivity among the IP modeling blocks and interactivity between the IP modeling blocks and the processor of the IC.

The host further can collect power consumption data that is generated. The power consumption data can be generated in various ways including during emulation of the electronic system. As discussed, the test platform upon which the IC is implemented can include power measuring circuitry that generates data indicating the amount of power consumed by the IC in which the configurable hardware platform is implemented. The power measuring circuitry can be read by the host or can be configured to send data to the host indicating the amount of power being consumed by the IC during the emulation. The data that is collected by the host can reflect the power consumption of the particular design architecture being emulated by the configurable hardware platform. As discussed, the power consumed by the IC can be determined by the power measurement circuitry on the test platform upon which the IC is mounted and which is in communication with the host.

It should be appreciated that since the architecture of the IC is known, e.g., the interfaces and/or buses between the IP modeling blocks and the processor are known and well defined. As such, the resulting performance, as measured through the monitor(s) and the testing platform can provide an accurate portrayal of an actual implementation of the design including circuit module implementations of one or more segments despite the IP modeling blocks not implementing the actual functionality of the selected segments. In any case, the data collected by the monitor(s) and/or test platform can be read from the IC by the host processing system in real time, in near-real time, or subsequent to the conclusion of the emulation process.

In block 850, the host can post process the performance data. Since the emulation does not match all aspects of an actual implementation of the electronic system specified by the design, the host can adjust various portions of the performance data such as the power consumption data that is collected. For example, the power consumption data can be adjusted according to the number of I/Os specified by the user. As noted, the number of I/Os can include the number of transceivers specified by the user, or the like. The actual configurable hardware platform, as implemented within the IC, utilizes a limited number of I/Os. Accordingly, the host can adjust, e.g., increase or decrease, the power consumption data according to the number of I/Os specified by the user in block 810. In view of the limited number of I/Os needed by the configurable hardware platform, the host typically increases the power consumption measurement determined for the IC during emulation in an amount that is dependent upon the number of additional I/Os. It should be appreciated that the power consumption measurement(s) can be increased (or decreased) different amounts for each respective type of I/O specified by the user.

Because the configurable hardware platform utilizes IP modeling blocks, multiple iterations testing different architectures for the design can be emulated using the single configuration bitstream. For example, if additional or fewer IP modeling blocks are required, the IP modeling blocks can be programmed using one of the techniques described within this specification without reloading a different configuration bitstream into the IC. IP modeling blocks can be programmed to emulate different circuits, e.g., generate different data traffic patterns, emulate different power profiles, be deactivated or activated to generate a particular data traffic pattern and/or power consumption characteristics without loading a different configuration bitstream into the IC. In one aspect, further updates to program code executed in the processor, e.g., the design, can be loaded into the IC via a communication port, thereby avoiding the need to load a different configuration bitstream into the IC only to alter or modify the program code executed by the processor of the configurable hardware platform implemented therein.

FIG. 8, in large part, describes the situation in which a particular electronic system for which various architectures are to be explored is specified, potentially incompletely, in the form of program code. It should be appreciated, however, that the one or more embodiments disclosed within this specification can be applied to other cases in which a system designer does not have program code available or written that specifies an electronic system. For example, the electronic system to be emulated may not include a processor. In another example, the designer may wish to obtain an idea of performance and/or power consumption prior to writing any code.

In either case, a system designer can interact with the host to define a particular electronic system to be emulated. The system designer, for example, can specify the number of IP modeling blocks to be included, indicate the particular IP core or circuit module that each IP modeling block is to emulate in terms of traffic patterns and/or power consumption, etc. The electronic system can be emulated in that form without a processor. In the event a processor is not required within the configurable hardware platform, a programmable IC that does not include a processor can be used.

In another aspect, the system designer can specify a particular type of interaction or schedule of operations for each of the IP modeling blocks that determines a level of interaction with the processor thereby permitting the system designer to explore different system architectures without providing program code specifying the system or program code that dictates operation of the processor within the configurable hardware platform. For example, in selecting a particular IP core to be emulated by an IP modeling block, the profile used can include a characteristic data pattern that is generated by the IP modeling block and a power profile that is implemented once programmed during emulation.

In another example, in selecting a particular circuit module, e.g., a DA converter or an FFT generator, to be emulated by an IP modeling block, the circuit designer can adjust the parameters specified within the modeling data for the IP modeling block. In illustration, if the FFT generator that is likely to be used by an electronic system to be emulated includes more gates or consumes more data than the FFT generator profile that can be emulated by an IP modeling block, one or more or all of the parameters of the FFT generator profile can be scaled by a user provided factor upward or downward as required so that the "stock" or "standard" hardware profiles provided for programming the IP modeling blocks can be adjusted as required.

In further illustration, one or more critical parameters can be directly input or provided by a user to more accurately model traffic. For example, as known, an FFT can be implemented with different architectures, transform lengths, bit widths, etc. Each of these parameters likely has an influence upon the traffic that is generated by the FFT. Accordingly, one or more values can be entered by the user explicitly defining these parameters thereby allowing the user to exert greater control over the performance profile that is generated.

As such, the configurable hardware platform can be used to emulate any of a variety of different electronic systems. Thus, the genesis for the emulation need not be program code defining segments that are selected for implementation as circuit modules. Rather, the circuit designer can simply select circuit modules to be emulated by IP modeling blocks and emulate the resulting electronic system as described.

Figure 9:
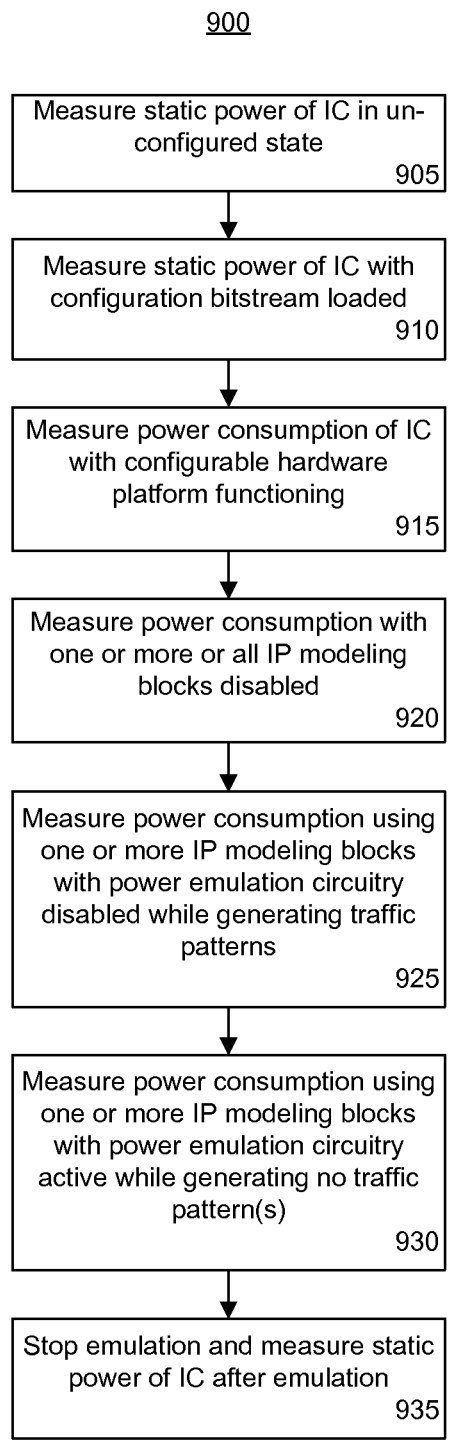
FIG. 9 is a flow chart illustrating an exemplary method of emulating an electronic system.

FIG. 9 is a flow chart illustrating an exemplary method 900 of emulating an electronic system. Method 900 can be performed using the emulation system described with reference to FIG. 1. Method 900 can begin in a state where the IC on the test platform has not yet been loaded with a configuration bitstream.

In block 905, the host can measure the static power consumption of the IC, e.g., as determined from the power measurement circuitry on the test platform. Block 905 measures the static power consumption of the IC without being loaded with configuration data, e.g., in a pre-configured state. In block 910, the host can measure the static power of the IC with the configuration bitstream specifying the configurable hardware platform, e.g., as illustrated in FIG. 4, FIG. 6, or FIG. 7, loaded into the IC. The IC implements the configurable hardware platform, but is not instructed to perform emulation, thereby allowing static power consumption of the IC to be measured. In block 915, the host can measure the power consumption of the IC while emulation is being performed. One or more or all of the IP modeling blocks, during block 915, are generating traffic patterns and have active power emulation circuits therein. As discussed, the power measurements, particularly for block 915, can be post-processed and adjusted according to the number and/or type of resources (e.g., I/Os) that are utilized as specified by the user.

In block 920, the host can measure power consumption with one or more of the IP modeling blocks disabled. In one aspect, for example, individual ones of the IP modeling blocks can be disabled during emulation under control of the processor, via commands from the host sent through another interface such as JTAG, by the gating scheduler, or the like. Accordingly, different ones, or groups of two or more, IP modeling blocks can be disabled during emulation to observe the power consumption while such IP modeling blocks are disabled. In another aspect, all IP modeling blocks can be disabled thereby allowing the host to measure power consumption of the processor alone, e.g., without any functioning IP modeling blocks.

In block 925, the host can measure the power consumption of the IC with one or more or all of the IP modeling blocks having the power emulation circuitry included therein disabled. In such a configuration, the IP modeling block can continue to generate a traffic pattern. Block 925, in effect, permits the power consumption of the interconnect circuitry to be determined.

In block 930, the host can measure the power consumption of the IC with one or more or all of the IP modeling blocks having traffic pattern generation disabled while the power emulation circuitry continues to operate, e.g., at a designated toggle rate. It should be appreciated that the toggle rate of any particular power emulation circuit of an IP modeling block can be modified during emulation via the configuration port of the relevant IP modeling block.

In block 935, the host can stop emulation and measure the static power consumption of the IC. By measuring the static power consumption of the IC with the emulation system still implemented therein, but emulation stopped, the host is able to measure total static power in a way that accounts for junction temperature increases due to operation of the IC. In one aspect, the IC can include one or more AD converters configured to measure temperature of the die of the IC. The temperature readings of the AD converter can be output from the IC to the host and utilized in power consumption computations and/or analysis.

The different ways in which power can be measured by the host, as described within FIG. 9, illustrate the various dynamic aspects of the emulation system in that operation of IP modeling blocks as a whole, traffic pattern generation of IP modeling blocks, and operation of power emulation circuitry within IP modeling blocks can be controlled dynamically during emulation. Capturing all of the power data described above also allows the host to perform computations to extrapolate and estimate power consumption across various portions of the design emulated within the IC.

The ability to dynamically enable IP modeling blocks or portions thereof is further enhanced in that modeling data can be provided to any one or more or all of the IP modeling blocks during emulation to change behaviors such as traffic generation or the particular power profile that is being implemented. For example, traffic generation can be increased or decreased (e.g., stopped) dynamically responsive to providing the IP modeling block with new or different modeling data during the emulation. Similarly, the power profile can be changed to increase or decrease (e.g., stop operation of the power emulation circuit) the toggle rate of the power emulation circuitry within an IP modeling block dynamically during emulation by providing new or updated modeling data to the IP modeling block.

In one aspect, the various operational parameters of the configurable hardware platform that can be modified dynamically during emulation can be controlled from the host. In another aspect, changes in power profiles, enabling and/or disabling of IP modeling blocks or portions thereof, changing traffic patterns, and the like, can be specified by the user at compile-time of the emulation system. In one aspect, for example, the processor can be configured to provide each IP modeling block with the necessary modeling data to effectuate the specified dynamic changes during emulation.

Figure 11:
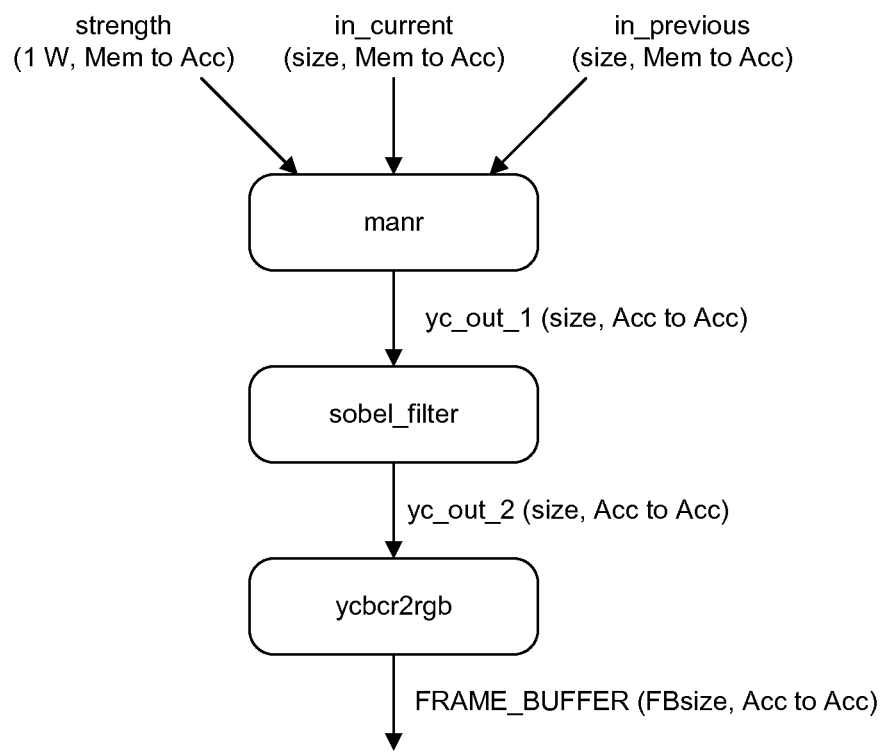
FIG. 11 is a block diagram illustrating an example of the processing performed by the host described with reference to FIGS. 1 and 3.
Figure 12:
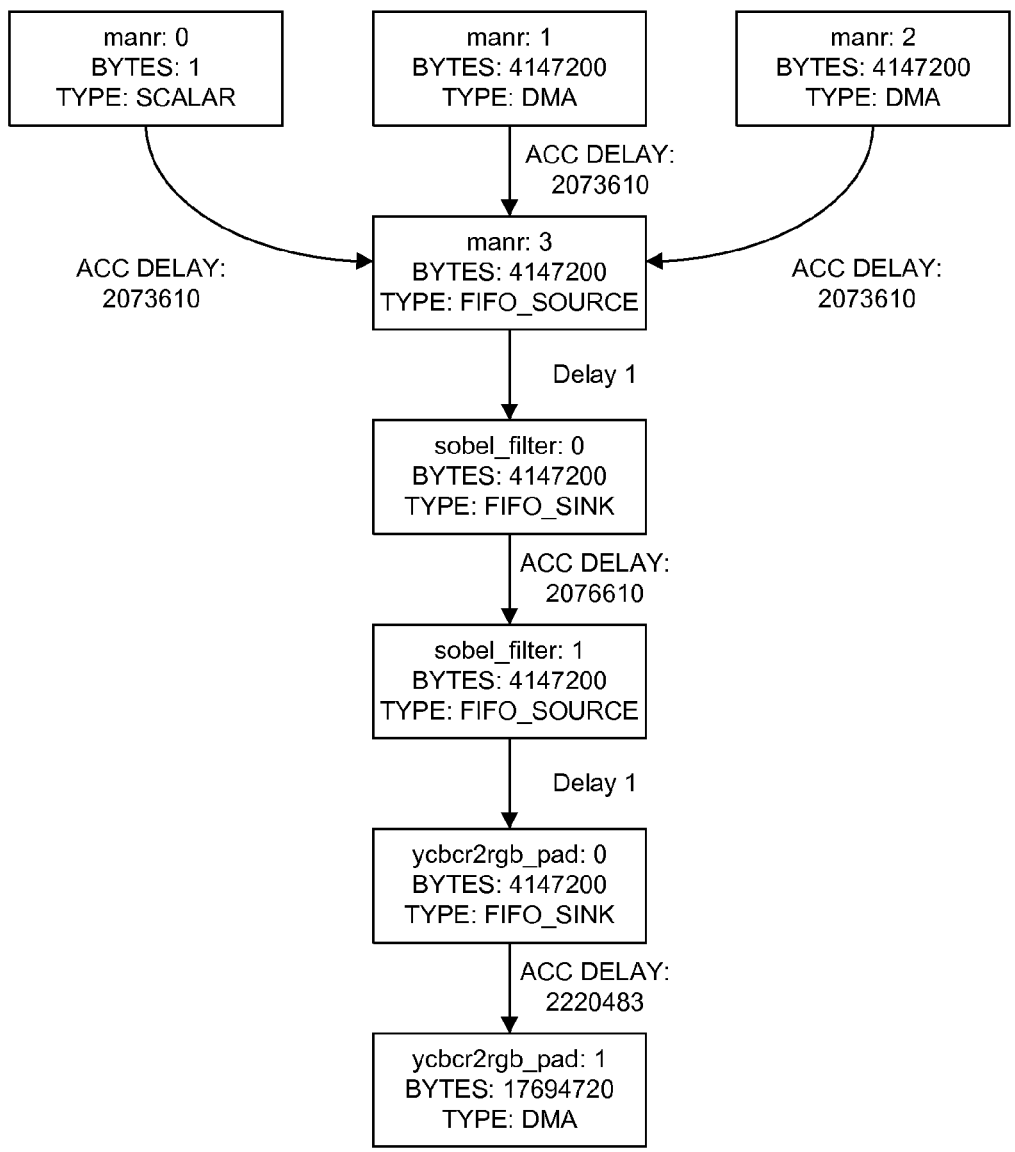
FIG. 12 is a block diagram illustrating another example of the processing performed by the host described with reference to FIGS. 1 and 3.

FIGS. 10-12 illustrate further aspects of blocks 820 and 825 of FIG. 8 as performed by the host. Taken collectively, FIGS. 10-12 illustrate one or more execution parameters that can be determined through an analysis of the design specified as a high level language.

FIG. 10 is exemplary program code 1000 specifying a design for an electronic system. FIG. 10 illustrates an example of a simplified video design specified in a high level language. The video design specified by FIG. 10 generally corresponds to a 3-stage pipeline. Program code 1000 includes a noise-reduction function ("manr") at line 7, a Sobel edge-detection function ("sobel_filter") at line 11, and a colorspace conversion function ("ycbcr2rgb") at line 12. For purposes of illustration, each of the functions is to a segment of a design.

FIG. 11 is a block diagram illustrating an example of the processing performed by host 105 executing CAS 350. As shown, the host has created a graph illustrating data flows of the video design described by program code 1000. FIG. 11 illustrates data flows into and out from each of the 3 stages of the video design. Each stage corresponds to a segment in this example and is represented by a node (e.g., a block). Lines flowing into and out from nodes represent a data flow that is provided as an input to the node or a data flow that is provided as an output from the node.

Referring to "manr," the three inputs to the function are illustrated as arrows flowing into the node. The first input "strength" has a size of 1 byte. The second two inputs "in_current" and "in_previous" each has a size defined by the variable "size." The host can determine the amount of data provided to "manr" at least in part according to the "size" variable used in line 3 of program code 1000 in reference to the "malloc" instruction and the size of the "strength" input. The "Mem to Acc" notation indicates that a memory copy operation has been determined to be suited for the data transfer as opposed to a direct memory access (DMA) operation.

The amount of data that is output from "manr" is defined as the variable "yc_out_1," which also defines the amount of data provided as input to "sobel_filter." The amount of data is defined by the "size" variable. The notation "Acc to Acc" indicates that a DMA operation has been determined to be suited for the data transfer as opposed to a memory copy. The amount of data that is provided as an output from "sobel_filter" is defined as "yc_out_2," which also defines the amount of data provided as an input to "ycbc2rgb" as "size." A DMA operation is recommended for the data transfer. The amount of data provided as an output from "ycbc2rgb" is defined as "FRAME_BUFFER" having a size of "FBsize" and uses a DMA operation to transfer the data.

In one aspect, the type of data transfer that is implemented can be determined according to the amount of data that is to be transferred. For large data transfers, e.g., amounts above a particular number of bytes, a DMA operation can be recommended, which correlates to a particular type of data traffic pattern.

Thus, FIG. 11 illustrates that the host is able to calculate the amounts of data, e.g., the quantity of data, to be transferred into and out from segments of the design. FIG. 11 further illustrates the source and destination of the data as well as the manner in which the data is transferred, e.g., either DMA or as a memory copy.

FIG. 12 is a block diagram illustrating another example of the processing performed by host 105 executing CAS 350. As shown, the host has created a further graph 1200 for the video design of FIG. 10. FIG. 12 illustrates further detail for data flows of the video system. Information specified in FIG. 12 can be obtained by performing synthesis upon the design of FIG. 10. As shown, additional hardware blocks are created and inserted as nodes. The additional hardware blocks further define the type of transfer that is to take place between various segments. For example, the transfer from "manr" involves a FIFO memory as indicated by the additional sources and sinks (FIFO_SOURCE and FIFO_SINK). In addition, a latency for transferring data from each source and sink is defined as an edge weight within graph 1200. The edge weight is specified as a number of clock cycles.

In one aspect, edge weights can be used to select particular ones of the segments for implementation as a circuit module. For example, a node having an edge weight that exceeds an upper threshold can be disqualified from consideration for implementation as a hardware module. The various parameters illustrated within the data flows of FIGS. 11 and 12 are directly usable or translatable into parameters of a performance profile. In this manner, the data flow parameters determined by the host are used as the performance profile for an IP modeling block selected to emulate a segment. For example, clock cycles determined as illustrated in FIG. 12 can be directly used as the amount of time the IP modeling block is to take to process a received input before sending the output data. Any synthesis data indicative of the size of a particular hardware block can be translated into a power profile parameter used to determine a location of the tap-off point within the power emulation circuitry, a toggle rate, etc. Thus, while the resulting hardware implementation is not utilized for purposes of emulation, in some cases, one or more parameters of the IP modeling blocks forming the performance profile are determined or obtained from the synthesis operations that are performed.

The inventive arrangements disclosed within this specification allow a system designer to emulate various architectures for an electronic system. The system designer is able to emulate various states of the circuit blocks by way of traffic generation and power profiles that govern operation of the power emulation circuit in each respective IP modeling block. Power islands also can be explored. Each IP modeling block emulates behavior of a circuit module but not the functionality. The behavior includes power consumption as represented by traffic patterns (data consumption and data generation) and any additional power consumption represented by the power emulation circuitry. Using the various aspects described within this specification, a system designer can obtain a highly accurate estimate of power consumption and energy usage for one or more alternative architectures for the electronic system being developed.

For purposes of explanation, specific nomenclature is set forth to provide a thorough understanding of the various inventive concepts disclosed herein. The terminology used herein, however, is for the purpose of describing particular embodiments only and is not intended to be limiting. For example, terms "a" and "an," as used herein, are defined as one or more than one. The term "plurality," as used herein, is defined as two or more than two. The term "another," as used herein, is defined as at least a second or more. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

The term "and/or" as used herein refers to and encompasses any and all possible combinations of one or more of the associated listed items. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof. It will also be understood that, although the terms first, second, etc. may be used herein to describe various elements, these elements should not be limited by these terms, as these terms are only used to distinguish one element from another.

The term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

Within this specification, the same reference characters are used to refer to terminals, signal lines, wires, and their corresponding signals. In this regard, the terms "signal," "wire," "connection," "terminal," and "pin" may be used interchangeably, from time-to-time, within this specification. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

One or more aspects can be realized in hardware or a combination of hardware and software. One or more aspects can be realized in a centralized fashion in one system or in a distributed fashion where different elements are spread across several interconnected systems. Any kind of data processing system or other apparatus adapted for carrying out at least a portion of the methods described herein is suited.

One or more aspects further can be embedded in a device such as a computer program product, which comprises all the features enabling the implementation of the methods described herein. The device can include a data storage medium, e.g., a non-transitory computer-usable or computer-readable storage medium, storing program code that, when loaded and executed in a system including a processor, causes the system to initiate and/or perform at least a portion of the functions described within this specification. Examples of data storage media can include, but are not limited to, optical media, magnetic media, magneto-optical media, computer memory such as random access memory, a bulk storage device, e.g., hard disk, or the like.

Accordingly, the flowchart and block diagrams in the Figures illustrate the architecture, functionality, and operation of possible implementations of systems, methods and computer program products according to various aspects disclosed herein. In this regard, each block in the flowchart or block diagrams may represent a module, segment, or portion of code, which includes one or more executable instructions for implementing the specified logical function(s). It should also be noted that, in some alternative implementations, the functions noted in the blocks may occur out of the order noted in the figures. For example, two blocks shown in succession may be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Thus, throughout this specification, statements utilizing terms such as "processing" or "computing" or "calculating" or "determining" or "displaying" or the like, refer to the action and processes of a data processing system, e.g., a computer system, or similar electronic computing device, that manipulates and transforms data represented as physical (electronic) quantities within the computer system's registers and/or memories into other data similarly represented as physical quantities within the computer system memories and/or registers or other such information storage, transmission or display devices.

The corresponding structures, materials, acts, and equivalents of all means or step plus function elements in the claims below are intended to include any structure, material, or act for performing the function in combination with other claimed elements as specifically claimed.

One or more aspects disclosed within this specification can be embodied in other forms without departing from the spirit or essential attributes thereof. Accordingly, reference should be made to the following claims, rather than to the foregoing specification, as indicating the scope of the one or more embodiments.

What is claimed is:

1. An integrated circuit comprising:
a processor operable to execute program code;
a first intellectual property (IP) modeling block comprising:
   a first port through which the first IP modeling block receives first modeling data comprising a power profile;
   a second port coupled to the processor through which the first IP modeling block communicates with the processor during emulation; and
   a power emulation circuit configured to consume a variable amount of power during emulation as programmed by the power profile of the first modeling data;
wherein the first IP modeling block is a circuit block implemented in programmable circuitry of the integrated circuit by loading configuration data and is programmed with the modeling data to mimic a segment of program code selected for hardware acceleration without performing a function of the segment of program code.

2. The integrated circuit of claim 1, wherein the modeling data specifies a toggle rate that is implemented by the power emulation circuit during emulation.

3. The integrated circuit of claim 1, wherein the IP modeling block further comprises:
a traffic generator configured to generate a first data traffic pattern with the processor according to the first modeling data.

4. The integrated circuit of claim 1, further comprising a second IP modeling block, wherein the second IP modeling block comprises a power emulation circuit configured to consume a variable amount of power as specified by second modeling data; and
wherein the second IP modeling block is configured independently of the first IP modeling block.

5. The integrated circuit of claim 1, wherein the processor sends the first modeling data to the first IP modeling block.

6. The integrated circuit of claim 1, wherein the power emulation circuit comprises:
a plurality of predetermined resources of the IC; and
a driver circuit driving the plurality of predetermined resources of the IC;
wherein selected ones of the plurality of predetermined resources are enabled during emulation according to the first modeling data.

7. The integrated circuit of claim 6, wherein the driver circuit generates data that propagates through the enabled ones of the plurality of predetermined resources at a toggle rate specified by the first modeling data.

8. The integrated circuit of claim 1, further comprising:
a gating scheduler;
wherein the gating scheduler is configured to disable the first IP modeling block according to a gate schedule during emulation.

9. A method of emulating power consumption of a design for an electronic system, the method comprising:
implementing a configurable hardware platform within a programmable integrated circuit by loading configuration data, wherein the configurable hardware platform comprises an intellectual property (IP) modeling block coupled to a processor of the programmable integrated circuit;
programming the IP modeling block with a performance profile specifying a data traffic pattern implemented by a traffic generator of the IP modeling block during emulation and a power profile specifying power consumption for a power emulation circuit within the IP modeling block implemented during emulation;
wherein the IP modeling block is programmed with the performance profile to mimic a segment of program code selected for hardware acceleration without performing a function of the segment of program code; and
measuring power consumption of the programmable integrated circuit while the configurable hardware platform is implemented within the programmable integrated circuit.

10. The method of claim 9, wherein the configurable hardware platform comprises a plurality of IP modeling blocks;
wherein each IP modeling block is assigned to one of a plurality of different power islands; and
wherein each IP modeling block is enabled and disabled according to a gating schedule regulating activation of the power islands during emulation.

11. The method of claim 9, wherein measuring power consumption of the programmable integrated circuit comprises:
measuring dynamic power consumption of the programmable integrated circuit during emulation with the configurable hardware platform implemented within the programmable integrated circuit during emulation.

12. The method of claim 9, further comprising:
measuring static power consumption of the programmable integrated circuit with the configurable hardware platform implemented within the programmable integrated circuit without conducting emulation using the configurable hardware platform.

13. The method of claim 9, further comprising:
measuring power consumption of the programmable integrated circuit while the power emulation circuit of the IP modeling block is not active and the traffic generator generates a data traffic pattern; or
measuring power consumption of the programmable integrated circuit while the power emulation circuit of the IP modeling block is active and the traffic generator does not generate a data traffic pattern.

14. The method of claim 9, further comprising:
measuring a temperature of the programmable integrated circuit as the IP modeling block is enabled and disabled during emulation.

* * * * *